United States Patent
Choi et al.

(10) Patent No.: US 11,692,268 B2
(45) Date of Patent: *Jul. 4, 2023

(54) GAS DIFFUSION SHOWER HEAD DESIGN FOR LARGE AREA PLASMA ENHANCED CHEMICAL VAPOR DEPOSITION

(71) Applicant: Applied Materials, Inc., Santa Clara, CA (US)

(72) Inventors: Soo Young Choi, Fremont, CA (US); John M. White, Hayward, CA (US); Robert I. Greene, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1134 days.

This patent is subject to a terminal disclaimer.

(21) Appl. No.: 14/261,117

(22) Filed: Apr. 24, 2014

(65) Prior Publication Data

US 2014/0230730 A1   Aug. 21, 2014

Related U.S. Application Data

(60) Continuation of application No. 12/254,742, filed on Oct. 20, 2008, now Pat. No. 8,795,793, which is a (Continued)

(51) Int. Cl.
*C23C 16/455*    (2006.01)
*C23C 16/44*    (2006.01)
(Continued)

(52) U.S. Cl.
CPC ........ *C23C 16/45559* (2013.01); *B05B 1/005* (2013.01); *C23C 16/4405* (2013.01); *C23C 16/45565* (2013.01); *H01J 37/3244* (2013.01)

(58) Field of Classification Search
CPC ............ B05B 1/005; C23C 16/4405; C23C 16/45559; C23C 16/45563–4558;
(Continued)

(56) References Cited

U.S. PATENT DOCUMENTS 4,184,638 A * 1/1980 Ogasawara ............. B05B 1/005
239/218
4,854,263 A * 8/1989 Chang .................. C23C 16/345
118/715
(Continued)

FOREIGN PATENT DOCUMENTS

EP    1099779 A1 * 5/2001 ....... C23C 16/45563
JP    10-168572      6/1998
(Continued)

OTHER PUBLICATIONS

U.S. Appl. No. 60/542,577 in the name of Lawrence Chung-Lai Lei et al., filed Feb. 6, 2004 and entitled "Anti-Clogging Nozzle for Semiconductor Processing." pp. 1-25. (Year: 2004).*

(Continued)

*Primary Examiner* — Jeffrie R Lund
(74) *Attorney, Agent, or Firm* — Patterson + Sheridan, LLP

(57) ABSTRACT

Embodiments of a gas distribution plate for distributing gas in a processing chamber are provided. In one embodiment, a gas distribution plate includes a diffuser plate having an upstream side and a downstream side, and a plurality of gas passages passing between the upstream and downstream sides of the diffuser plate. At least one of the gas passages has a cylindrical shape for a portion of its length extending from the upstream side and a coaxial conical shape for the remainder length of the diffuser plate, the upstream end of the conical portion having substantially the same diameter as the cylindrical portion and the downstream end of the conical portion having a larger diameter.

20 Claims, 12 Drawing Sheets

Related U.S. Application Data division of application No. 10/823,347, filed on Apr. 12, 2004, now abandoned.

(51) Int. Cl.
*H01J 37/32* (2006.01)
*B05B 1/00* (2006.01)

(58) Field of Classification Search
CPC ........ C23C 16/45565; C23C 16/45574; C23C 16/505; C23C 16/509; C23C 16/513; C30B 25/14; H01J 2237/3325; H01J 37/3244; H01J 37/32596; H01J 2237/327; H01J 2237/334; H01J 37/32009; H01J 37/32082; H01J 37/32091; H01J 37/32357; H01J 37/32532; H01J 37/32541; H01J 21/02274; H01J 21/67207; H01J 2237/32541; H01L 21/02274; H01L 21/67207; B23K 26/384; F02M 61/1806; F02M 61/1833; F02M 61/1846; F02M 61/1853; H05B 3/26; H05B 2203/005
See application file for complete search history.

(56) References Cited

U.S. PATENT DOCUMENTS

| | | | | |
|---|---|---|---|---|
| 4,909,914 A * | 3/1990 | Chiba | B01J 19/26 | 118/715 |
| 5,359,254 A * | 10/1994 | Arkhipov | H01J 3/025 | 313/15 |
| 5,512,078 A * | 4/1996 | Griffin | C03B 23/057 | 219/121.61 |
| 5,573,682 A * | 11/1996 | Beason, Jr. | H05H 1/34 | 219/121.47 |
| 5,645,644 A * | 7/1997 | Mabuchi | H01J 37/32192 | 118/723 ME |
| 5,728,223 A * | 3/1998 | Murakami | C23C 16/455 | 118/715 |
| 5,773,100 A * | 6/1998 | Chang | C23C 16/345 | 427/255.29 |
| 5,935,337 A * | 8/1999 | Takeuchi | C23C 16/45565 | 118/724 |
| 5,950,925 A * | 9/1999 | Fukunaga | C23C 16/45512 | 239/132.3 |
| 6,024,799 A * | 2/2000 | Chen | C23C 16/455 | 118/715 |
| 6,041,886 A | 3/2000 | Nakaishi et al. | | |
| 6,089,698 A * | 7/2000 | Temple | B41J 2/162 | 347/47 |
| 6,106,663 A * | 8/2000 | Kuthi | H01J 37/32082 | 156/345.34 |
| 6,177,023 B1 * | 1/2001 | Shang | C23C 14/50 | 118/728 |
| 6,182,603 B1 * | 2/2001 | Shang | C23C 16/4404 | 118/723 ME |
| 6,329,632 B1 * | 12/2001 | Fournier | B23K 26/382 | 219/121.61 |
| 6,334,983 B1 * | 1/2002 | Okayama | C23C 16/455 | 156/345.34 |
| 6,364,949 B1 * | 4/2002 | Or | C23C 16/4412 | 118/724 |
| 6,446,573 B2 * | 9/2002 | Hirayama | C23C 16/511 | 118/723 MW |
| 6,454,860 B2 * | 9/2002 | Metzner | C23C 16/407 | 118/715 |
| 6,477,980 B1 * | 11/2002 | White | C23C 16/455 | 118/715 |
| 6,565,661 B1 * | 5/2003 | Nguyen | C23C 16/4557 | 118/715 |
| 6,826,833 B1 * | 12/2004 | Maier | B23P 15/16 | 239/463 |
| 6,852,139 B2 * | 2/2005 | Zhang | C23C 16/30 | 29/623.5 |
| 6,886,240 B2 * | 5/2005 | Zhang | C23C 16/40 | 29/623.5 |
| 6,942,753 B2 * | 9/2005 | Choi | C23C 16/45565 | 118/715 |
| 7,270,713 B2 * | 9/2007 | Blonigan | C23C 16/455 | 118/715 |
| RE39,939 E * | 12/2007 | Okayama | C23C 16/455 | 156/345.34 |
| RE39,969 E * | 1/2008 | Okayama | C23C 16/455 | 156/345.34 |
| RE40,046 E * | 2/2008 | Okayama | B23P 15/16 | 239/463 |
| 8,074,599 B2 * | 12/2011 | Choi | H01J 37/3244 | 118/723 R |
| 8,083,853 B2 * | 12/2011 | Choi | C23C 16/345 | 118/715 |
| 8,328,939 B2 * | 12/2012 | Choi | C23C 16/345 | 118/715 |
| 8,721,791 B2 * | 5/2014 | Tiner | B05B 1/005 | 118/715 |
| 8,795,793 B2 * | 8/2014 | Choi | C23C 16/45565 | 118/715 |
| 9,200,368 B2 * | 12/2015 | Choi | C23C 16/345 | |
| 10,262,837 B2 * | 4/2019 | Choi | C23C 16/30 | 29/623.5 |
| 10,312,058 B2 * | 6/2019 | Choi | C23C 16/40 | 29/623.5 |
| 2001/0010207 A1 * | 8/2001 | Yamamoto | H01J 37/32192 | 118/723 MW |
| 2001/0011526 A1 * | 8/2001 | Doering | H01L 21/6719 | 118/729 |
| 2001/0015074 A1 * | 8/2001 | Hosokawa | H01L 21/67184 | 62/378 |
| 2001/0015175 A1 * | 8/2001 | Masuda | H01J 37/32972 | 118/723 R |
| 2001/0024609 A1 * | 9/2001 | White | B65G 49/064 | 414/217 |
| 2001/0035127 A1 * | 11/2001 | Metzner | C23C 16/4405 | 118/715 |
| 2001/0052322 A1 * | 12/2001 | Hirayama | C23C 16/511 | 118/723 MW |
| 2002/0086260 A1 * | 7/2002 | Shang | H01L 21/67109 | 432/247 |
| 2002/0190651 A1 * | 12/2002 | Law | H01J 11/12 | 313/587 |
| 2002/0192370 A1 * | 12/2002 | Metzner | C23C 16/407 | 427/248.1 |
| 2003/0019580 A1 * | 1/2003 | Strang | C23C 16/45589 | 156/345.33 |
| 2003/0024647 A1 * | 2/2003 | Tadera | H01J 37/32211 | 156/345.41 |
| 2003/0056720 A1 * | 3/2003 | Dauelsberg | C23C 16/45574 | 117/200 |
| 2003/0066607 A1 * | 4/2003 | White | H01J 37/3244 | 156/345.34 |
| 2003/0070616 A1 * | 4/2003 | Shang | H02N 13/00 | 118/503 |
| 2003/0132213 A1 * | 7/2003 | Kim | H01L 21/67109 | 219/390 |
| 2003/0140851 A1 * | 7/2003 | Janakiraman | C23C 16/45565 | 118/715 |
| 2003/0141820 A1 * | 7/2003 | White | H01J 37/3266 | 315/111.21 |
| 2003/0199175 A1 * | 10/2003 | Tang | H01L 21/0217 | 438/791 |
| 2003/0207033 A1 * | 11/2003 | Yim | C23C 16/45565 | 427/255.37 |
| 2003/0209323 A1 * | 11/2003 | Yokogaki | C23C 16/45565 | 156/345.34 |
| 2004/0040504 A1 * | 3/2004 | Yamazaki | H01L 21/67184 | 118/715 |
| 2004/0061447 A1 * | 4/2004 | Saigusa | H01J 37/32009 | 315/111.21 |

(56) References Cited

U.S. PATENT DOCUMENTS

| | | | | |
|---|---|---|---|---|
| 2004/0065656 | A1* | 4/2004 | Inagawa | H01L 21/67248 219/444.1 |
| 2004/0129211 | A1* | 7/2004 | Blonigan | C23C 16/45591 118/715 |
| 2004/0129217 | A1* | 7/2004 | Strang | H01J 37/32935 118/715 |
| 2004/0149716 | A1* | 8/2004 | Inagawa | H01L 21/67109 219/405 |
| 2004/0163761 | A1* | 8/2004 | Strang | H01L 21/67017 156/345.33 |
| 2004/0173313 | A1* | 9/2004 | Beach | C03B 29/02 156/345.33 |
| 2004/0174114 | A1* | 9/2004 | Ohishi | C23C 16/407 118/715 |
| 2004/0206305 | A1* | 10/2004 | Choi | C23C 16/45565 118/715 |
| 2004/0206833 | A1* | 10/2004 | Kawazoe | F02M 51/0667 239/533.12 |
| 2004/0226513 | A1* | 11/2004 | Inagawa | H01L 21/67109 118/724 |
| 2005/0008772 | A1* | 1/2005 | Zhang | H01M 10/0562 427/126.1 |
| 2005/0016458 | A1* | 1/2005 | Zhang | C23C 16/5096 118/723 R |
| 2005/0109460 | A1* | 5/2005 | DeDontney | C23C 16/45574 156/345.33 |
| 2005/0126484 | A1* | 6/2005 | Zhao | C23C 16/45565 118/715 |
| 2005/0218115 | A1* | 10/2005 | Lei | C23C 16/45563 216/59 |
| 2005/0223986 | A1* | 10/2005 | Choi | C23C 16/45559 427/248.1 |
| 2006/0038554 | A1* | 2/2006 | Kurita | G01R 31/305 324/750.19 |
| 2006/0191479 | A1* | 8/2006 | Mizukami | C23C 16/45563 118/723 E |
| 2009/0104376 | A1* | 4/2009 | Choi | C23C 16/45559 134/1.1 |
| 2014/0230730 | A1* | 8/2014 | Choi | C23C 16/45559 239/548 |

FOREIGN PATENT DOCUMENTS

| | | | | |
|---|---|---|---|---|
| JP | 4260404 B2 | * | 4/2009 | C23C 16/45565 |
| TW | 200427862 A | * | 12/2004 | C23C 16/402 |
| WO | 98/46808 | | 10/1998 | |
| WO | WO-0111229 A1 | * | 2/2001 | B23P 15/16 |
| WO | WO-0175188 A2 | * | 10/2001 | C23C 16/45589 |
| WO | 03/003414 | | 1/2003 | |
| WO | WO 03003414 A2 | * | 1/2003 | H01J 37/3244 |
| WO | WO-03026832 A1 | * | 4/2003 | B05B 1/185 |

OTHER PUBLICATIONS

"Chapter 11: Flat Plates" in Warren C. Young et al "Roark's Formulas for Stress and Strain." McGraw-Hill Professional. 2002. pp. 427-524. (Year: 2002).*

"Table 11.4: Formulas for Flat Plates with Straight Boundaries and Constant Thickness" in Warren C. Young et al "Roark's Formulas for Stress and Strain." McGraw-Hill Professional. 2002. pp. 502-520. (Year: 2002).*

"Appendix A: Data for Engineering Materials" in Michael F. Ashby. "Materials Selection In Mechanical Design, 4th Edition." Butterworth-Heinemann. 2011. pp. 496-523. (Year: 2011).*

"Appendix B: Useful Solutions for Standard Problems" in Michael F. Ashby. "Materials Selection In Mechanical Design, 4th Edition." Butterworth-Heinemann. 2011. pp. 525-558. (Year: 2011).*

Darrel G. Hopper et al. "Review of Ultra-Resolution (10-100 Megapixel) Visualization Systems Built by Tiling Commercial Display Components." Proceedings of SPIE vol. 4712 (2002): Cockpit Displays IX: Displays for Defense Applications, pp. 282-299. (Year: 2002).*

Tim L. Dawson. "Developments In Colour Display Devices." Review of Progress in Coloration and Related Topics 33 [1] (2003). pp. 1-14. (Year: 2003).*

Liza Boland. "Xilinx Devices in Flat Panel Displays." XILINX White Paper No. 196 (Jul. 24, 2003). Xilinx, Inc. (www.xilinx.com). pp. 1-28. (Year: 2003).*

Hiroshi Komatsu. "R&D Trends in Flat Panel Display Technology." Science & Technology Trends: Quarterly Review No. 14. (Jan. 2005). NISTEP (https://nistep.repo.nii.ac.jp). pp. 26-40. (Year: 2004).*

Thomas Slot et al. "Effective Elastic Constants for Thick Perforated Plates with Square and Triangular Penetration Patterns." Journal of Engineering for Industry. 93 [4] (1971). pp. 935-942. (Year: 1971).*

Thomas Slot. "Stress Analysis of Thick Perforated Plates." Technomic Publishing Co., Inc., Westport, CT, US. 1972. pp. 256. Available online Sep. 6, 2020 at: http://resolver.tudelft.nl/uuid:2e06dec0-0cef-4e85-9cce-b10e50670ab1. (Year: 1972).*

William J. O'Donnell. "Effective Elastic Constants for the Bending of Thin Perforated Plates with Triangular and Square Penetration Patterns." Journal of Engineering for Industry. 95 [1] (1973). pp. 121-128. (Year: 1973).*

ASME. ASME Boiler and Pressure Vessel Code. Section III Rules for Construction of Nuclear Facility Components. Appendix A Stress Analysis Method. Article A-8000 Stresses in Perforated Flat Plates. The American Society of Mechanical Engineers (2004). pp. 193-205. (Year: 2004).*

"Designers, Specifiers and Buyers Handbook for Perforated Metals." Industrial Perforators Association (IPA). (1993). pp. 124. Available online Sep. 6, 2020: https://www.marcospecialtysteel.com/content/uploads/2017/01/Perforated-Handbook-for-designers-min.pdf. (Year: 1993).*

M. F. Ashby et al. "The Mechanical Properties of Natural Materials. I. Material Property Charts." Proc. R. Soc. Lond. A. 459 [2031] (1995). pp. 123-140. (Year: 1995).*

L. J. Gibson et al. "The Mechanical Properties of Natural Materials. II. Microstructures for Mechanical Efficiency." Proc. R. Soc. Lond. A. 450 [1938] (1995). pp. 141-162. (Year: 1995).*

Ole Sigmund. "A Tool for the Tailoring of Structures and Materials." Phil. Trans. R. Soc. Lond. A. 358 [1765] (2000). pp. 211-227. (Year: 2000).*

H. Li et al. "Limit Analysis of Ductile Composites Based on Homogenization Theory." Proc. R. Soc. Lond. A. 459 [2031] (2003). pp. 659-675. (Year: 2003).*

U.S. Appl. No. 52/981,903, filed Dec. 15, 2003 in the names of Mosheng Zhao et al., and entitled "Edge Flow Faceplate for Improvement of CVD Film Properties." pp. 1-25. (Year: 2003).*

Notice of Rejection dated Jan. 25, 2011 for Japanese Patent Application No. 2005-114911.

Official Letter dated Apr. 29, 2011, from Chinese Patent Office for corresponding Chinese Patent Application No. 200510067274.3.

Notice of Rejection dated Aug. 23, 2011 for corresponding Japanese Patent Application No. 2005-114911.

Official Letter dated Mar. 29, 2012 from Chinese Patent Office for corresponding Chinese Patent Application No. 200510067274.3.

* cited by examiner

GAS DIFFUSION SHOWER HEAD DESIGN FOR LARGE AREA PLASMA ENHANCED CHEMICAL VAPOR DEPOSITION

CROSS-REFERENCE TO RELATED APPLICATIONS

This application is a continuation application of U.S. patent application Ser. No. 12/254,742, filed Oct. 20, 2008, which is a divisional application of U.S. patent application Ser. No. 10/823,347, filed Apr. 12, 2004, now abandoned, both of which are herein incorporated by reference in its entirety.

BACKGROUND OF THE DISCLOSURE

Field of the Invention

Embodiments of the invention generally relate to a gas distribution plate assembly and method for distributing gas in a processing chamber.

Description of the Background Art

Liquid crystal displays or flat panels are commonly used for active matrix displays such as computer and television monitors. Plasma enhanced chemical vapor deposition (PECVD) is generally employed to deposit thin films on a substrate such as a transparent glass substrate (for flat panel) or semiconductor wafer. PECVD is generally accomplished by introducing a precursor gas or gas mixture into a vacuum chamber that contains a flat panel. The precursor gas or gas mixture is typically directed downwardly through a distribution plate situated near the top of the chamber. The precursor gas or gas mixture in the chamber is energized (e.g., excited) into a plasma by applying radio frequency (RF) power to the chamber from one or more RF sources coupled to the chamber. The excited gas or gas mixture reacts to form a layer of material on a surface of the flat panel that is positioned on a temperature controlled substrate support. Volatile by-products produced during the reaction are pumped from the chamber through an exhaust system.

Flat panels processed by PECVD techniques are typically large, often exceeding 370 mm×470 mm and ranging over 1 square meter in size. Large area substrates approaching and exceeding 4 square meters are envisioned in the near future. Gas distribution plates utilized to provide uniform process gas flow over flat panels are relatively large in size, particularly as compared to gas distribution plates utilized for 200 mm and 300 mm semiconductor wafer processing.

Large gas distribution plates utilized for flat panel processing have a number of fabricating issues that result in high manufacturing costs. For example, gas flow holes formed through the gas distribution plate are small in diameter relative to thickness of the gas distribution plate, for example a 0.016 inch diameter hole through a 1.2 inch thick plate, resulting in a high frequency of drill bit breakage during hole formation. Removal of broken drill bits is time consuming and may result in the entire gas distribution plate being scrapped. Additionally, as the number of gas flow holes formed through the gas distribution plate is proportional to the size of the flat panel, the great number of holes formed in each plate disadvantageously contributes to a high probability of trouble during plate fabrication. Moreover, the high number of holes coupled with the care required to minimize drill bit breakage results in long fabrication times, thereby elevating fabrication costs.

As the cost of materials for manufacturing the gas distribution plate is great, it would be advantageous to develop a gas distribution plate in a configuration that can be efficiently and cost effectively fabricated. Moreover, as the size of the next generation gas distribution plates is increased to accommodate processing flat panels in excess of 1.2 square meters, resolution of the aforementioned problems becomes increasingly important. While addressing the cost implications of the design of large gas distribution plates is important, performance attributes must not be overlooked. For example, the configuration, location and density of gas flow holes directly impact deposition performance, such as deposition rate and uniformity, and cleaning attributes, such as cleaning efficiency and residual cleaning chemical(s) in the process chamber.

Therefore, there is a need for an improved gas distribution plate assembly that reduces the manufacturing cost, and has good deposition and cleaning performance.

SUMMARY OF THE INVENTION

Embodiments of a gas distribution plate for distributing gas in a processing chamber are provided. In one embodiment, a gas distribution plate assembly for a plasma processing chamber comprises a diffuser plate having an upstream side and a downstream side, and a plurality of gas passages passing between the upstream and downstream sides, wherein at least one of the gas passages has a right cylindrical shape for a portion of its length extending from the upstream side and a coaxial conical shape for the remaining length of the diffuser plate, the upstream end of the conical portion having substantially the same diameter as the right cylindrical portion and the downstream end of the conical portion having a larger diameter.

In another embodiment, a gas distribution plate assembly for a plasma processing chamber comprises a diffuser plate having an upstream side and a downstream side in the plasma process chamber that is coupled to a remote plasma source and the remote plasma source is coupled to a fluorine source, and a plurality of gas passages passing between the upstream and downstream sides, wherein at least one of the gas passages has a right cylindrical shape for a portion of its length extending from the upstream side and a coaxial conical shape for the remaining length of the diffuser plate, the upstream end of the conical portion having substantially the same diameter as the right cylindrical portion and the downstream end of the conical portion having a larger diameter.

In another embodiment, a gas distribution plate assembly for a plasma processing chamber comprises a diffuser plate having an upstream side and a downstream side, and a plurality of gas passages passing between the upstream and downstream sides, wherein at least one of the gas passages has a first right cylindrical shape for a portion of its length extending from the upstream side, a second coaxial right cylindrical shape with a smaller diameter connected to the first cylindrical shape, a coaxial conical shape connected to the second cylindrical shape for the remaining length of the diffuser plate, with the upstream end of the conical portion having substantially the same diameter as the second right cylindrical shape and the downstream end of the conical portion having a larger diameter.

In another embodiment, a gas distribution plate assembly for a plasma processing chamber comprises a diffuser plate having an upstream side and a downstream side in the plasma process chamber that is coupled to a remote plasma source and the remote plasma source is coupled to a fluorine source, and a plurality of gas passages passing between the upstream and downstream sides, wherein at least one of the gas passages has a first right cylindrical shape for a portion of its length extending from the upstream side, a second coaxial right cylindrical shape with a smaller diameter connected to the first cylindrical shape, a coaxial conical shape connected to the second cylindrical shape for the remaining length of the diffuser plate, with the upstream end of the conical portion having substantially the same diameter as the second right cylindrical shape and the downstream end of the conical portion having a larger diameter.

In another embodiment, a method of depositing a thin film on a substrate comprises placing a substrate in a process chamber with a diffuser plate having an upstream side and a downstream side, and a plurality of gas passages passing between the upstream and downstream sides, wherein at least one of the gas passages has a right cylindrical shape for a portion of its length extending from the upstream side and a coaxial conical shape for the remaining length of the diffuser plate, the upstream end of the conical portion having substantially the same diameter as the right cylindrical portion and the downstream end of the conical portion having a larger diameter, and depositing a thin film on the substrate in the process chamber.

In another embodiment, a method of depositing a thin film on a substrate comprises placing a substrate in a process chamber with a diffuser plate having an upstream side and a downstream side, and a plurality of gas passages passing between the upstream and downstream sides, wherein at least one of the gas passages has a first right cylindrical shape for a portion of its length extending from the upstream side, a second coaxial right cylindrical shape with a smaller diameter connected to the first cylindrical shape, a coaxial conical shape connected to the second cylindrical shape for the remaining length of the diffuser plate, with the upstream end of the conical portion having substantially the same diameter as the second right cylindrical shape and the downstream end of the conical portion having a larger diameter, and depositing a thin film on the substrate in the process chamber.

In another embodiment, a method of cleaning a process chamber comprises placing a substrate in a process chamber, which is coupled to a remote plasma source and the remote plasma source is coupled to a fluorine source, with a diffuser plate having an upstream side and a downstream side, and a plurality of gas passages passing between the upstream and downstream sides, wherein at least one of the gas passages has a right cylindrical shape for a portion of its length extending from the upstream side and a coaxial conical shape for the remaining length of the diffuser plate, the upstream end of the conical portion having substantially the same diameter as the right cylindrical portion and the downstream end of the conical portion having a larger diameter, depositing a thin film on the substrate in the process chamber, determining if the number of processed substrates having reached a pre-determined cleaning limit, repeating the steps of placing a substrate in the process chamber, depositing a thin film on the substrate and determining if the number of processed substrates has reached the pre-determined cleaning limit until the number of process substrates has reached the pre-determined cleaning limit, if the number of processed substrates has not reached the pre-determined cleaning limit, and cleaning the process chamber if the number of processed substrates has reached the pre-determined cleaning limit.

In yet another embodiment, a method of cleaning a process chamber comprises placing a substrate in a process chamber, which is coupled to a remote plasma source and the remote plasma source is coupled to a fluorine source, with a diffuser plate having an upstream side and a downstream side, and a plurality of gas passages passing between the upstream and downstream sides, wherein at least one of the gas passages has a first right cylindrical shape for a portion of its length extending from the upstream side, a second coaxial right cylindrical shape with a smaller diameter connected to the first cylindrical shape, a coaxial conical shape connected to the second cylindrical shape for the remaining length of the diffuser plate, with the upstream end of the conical portion having substantially the same diameter as the second right cylindrical shape and the downstream end of the conical portion having a larger diameter, depositing a thin film on the substrate in the process chamber, determining if the number of processed substrates has reached a pre-determined cleaning limit, repeating the steps of placing a substrate in the process chamber, depositing a thin film on the substrate and determining if the number of processed substrates has reached the pre-determined cleaning limit until the number of process substrates has reached the pre-determined cleaning limit, if the number of processed substrates has not reached the pre-determined cleaning limit, and cleaning the process chamber if the number of processed substrates has reached the pre-determined cleaning limit.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The invention generally provides a gas distribution plate assembly for providing gas delivery within a processing chamber. The invention is illustratively described below in reference to a plasma enhanced chemical vapor deposition system configured to process large area substrates, such as a plasma enhanced chemical vapor deposition (PECVD) system, available from AKT, a division of Applied Materials, Inc., Santa Clara, Calif. However, it should be understood that the invention has utility in other system configurations such as etch systems, other chemical vapor deposition systems and any other system in which distributing gas within a process chamber is desired, including those systems configured to process round substrates.

Figure 1:
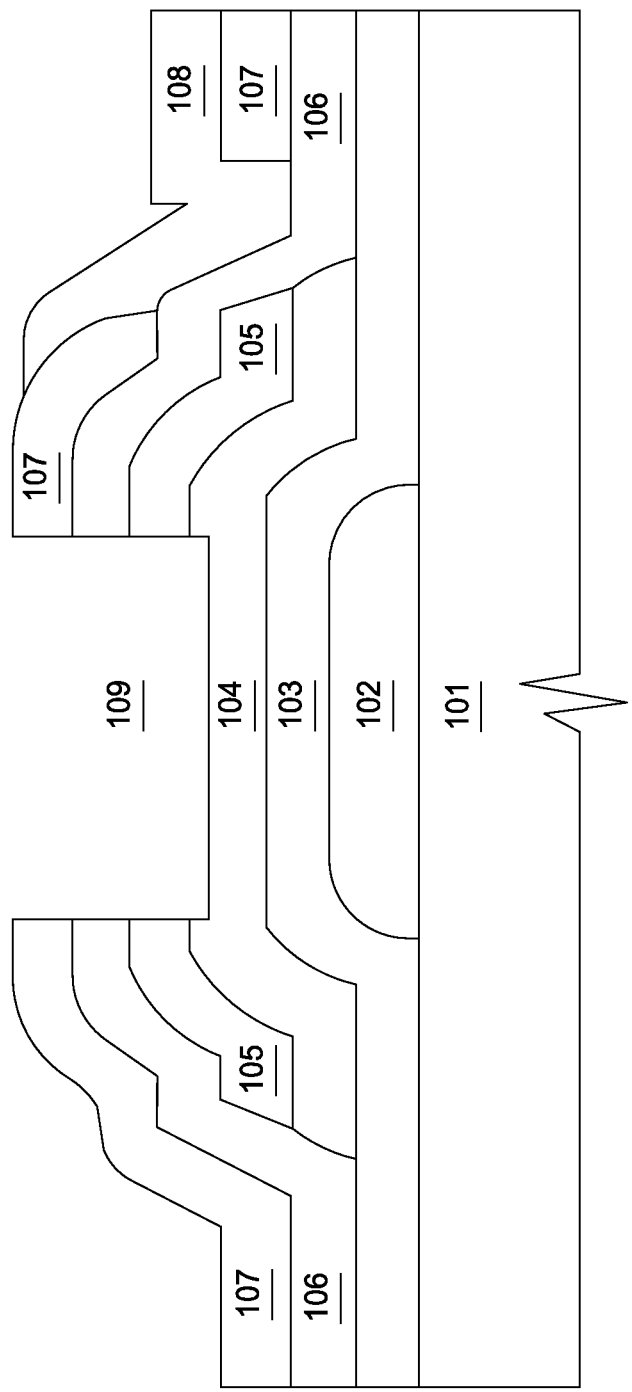
FIG. 1 depicts a cross-sectional schematic view of a bottom gate thin film transistor.

FIG. 1 illustrates cross-sectional schematic views of a thin film transistor structure. A common TFT structure is the back channel etch (BCE) inverted staggered (or bottom gate) TFT structure shown in FIG. 1. The BCE process is preferred, because the gate dielectric (SiN), and the intrinsic as well as n+ doped amorphous silicon films can be deposited in the same PECVD pump-down run. The BCE process shown here involves only 4 patterning masks. The substrate 101 may comprise a material that is essentially optically transparent in the visible spectrum, such as, for example, glass or clear plastic. The substrate may be of varying shapes or dimensions. Typically, for TFT applications, the substrate is a glass substrate with a surface area greater than about 500 mm$^2$. A gate electrode layer 102 is formed on the substrate 101. The gate electrode layer 102 comprises an electrically conductive layer that controls the movement of charge carriers within the TFT. The gate electrode layer 102 may comprise a metal such as, for example, aluminum (Al), tungsten (W), chromium (Cr), tantalum (Ta), or combinations thereof, among others. The gate electrode layer 102 may be formed using conventional deposition, lithography and etching techniques. Between the substrate 101 and the gate electrode layer 102, there may be an optional insulating material, for example, such as silicon dioxide (SiO$_2$) or silicon nitride (SiN), which may also be formed using an embodiment of a PECVD system described in this invention. The gate electrode layer 102 is then lithographically patterned and etched using conventional techniques to define the gate electrode.

A gate dielectric layer 103 is formed on the gate electrode layer 102. The gate dielectric layer 103 may be silicon dioxide (SiO$_2$), silicon oxynitride (SiON), or silicon nitride (SiN), deposited using an embodiment of a PECVD system described in this invention. The gate dielectric layer 103 may be formed to a thickness in the range of about 100 Å to about 6000 Å.

A bulk semiconductor layer 104 is formed on the gate dielectric layer 103. The bulk semiconductor layer 104 may comprise polycrystalline silicon (polysilicon) or amorphous silicon (α-Si), which could be deposited using an embodiment of a PECVD system described in this invention or other conventional methods known to the art. Bulk semiconductor layer 104 may be deposited to a thickness in the range of about 100 Å to about 3000 Å. A doped semiconductor layer 105 is formed on top of the semiconductor layer 104. The doped semiconductor layer 105 may comprise n-type (n+) or p-type (p+) doped polycrystalline (polysilicon) or amorphous silicon (α-Si), which could be deposited using an embodiment of a PECVD system described in this invention or other conventional methods known to the art. Doped semiconductor layer 105 may be deposited to a thickness within a range of about 100 Å to about 3000 Å. An example of the doped semiconductor layer 105 is n+ doped α-Si film. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surface. The conductive layer 106 may comprise a metal such as, for example, aluminum (Al), tungsten (W), molybdenum (Mo), chromium (Cr), tantalum (Ta), and combinations thereof, among others. The conductive layer 106 may be formed using conventional deposition techniques. Both the conductive layer 106 and the doped semiconductor layer 105 may be lithographically patterned to define source and drain contacts of the TFT. Afterwards, a passivation layer 107 may be deposited. Passivation layer 107 conformably coats exposed surfaces. The passivation layer 107 is generally an insulator and may comprise, for example, silicon dioxide (SiO$_2$) or silicon nitride (SiN). The passivation layer 107 may be formed using, for example, PECVD or other conventional methods known to the art. The passivation layer 107 may be deposited to a thickness in the range of about 1000 Å to about 5000 Å. The passivation layer 107 is then lithographically patterned and etched using conventional techniques to open contact holes in the passivation layer.

A transparent conductor layer 108 is then deposited and patterned to make contacts with the conductive layer 106. The transparent conductor layer 108 comprises a material that is essentially optically transparent in the visible spectrum and is electrically conductive. Transparent conductor layer 108 may comprise, for example, indium tin oxide (ITO) or zinc oxide, among others. Patterning of the transparent conductive layer 108 is accomplished by conventional lithographical and etching techniques.

The doped or un-doped (intrinsic) amorphous silicon (α-Si), silicon dioxide (SiO2), silicon oxynitride (SiON) and silicon nitride (SiN) films used in liquid crystal displays (or flat panels) could all be deposited using an embodiment of a plasma enhanced chemical vapor deposition (PECVD) system described in this invention.

Figure 2A:
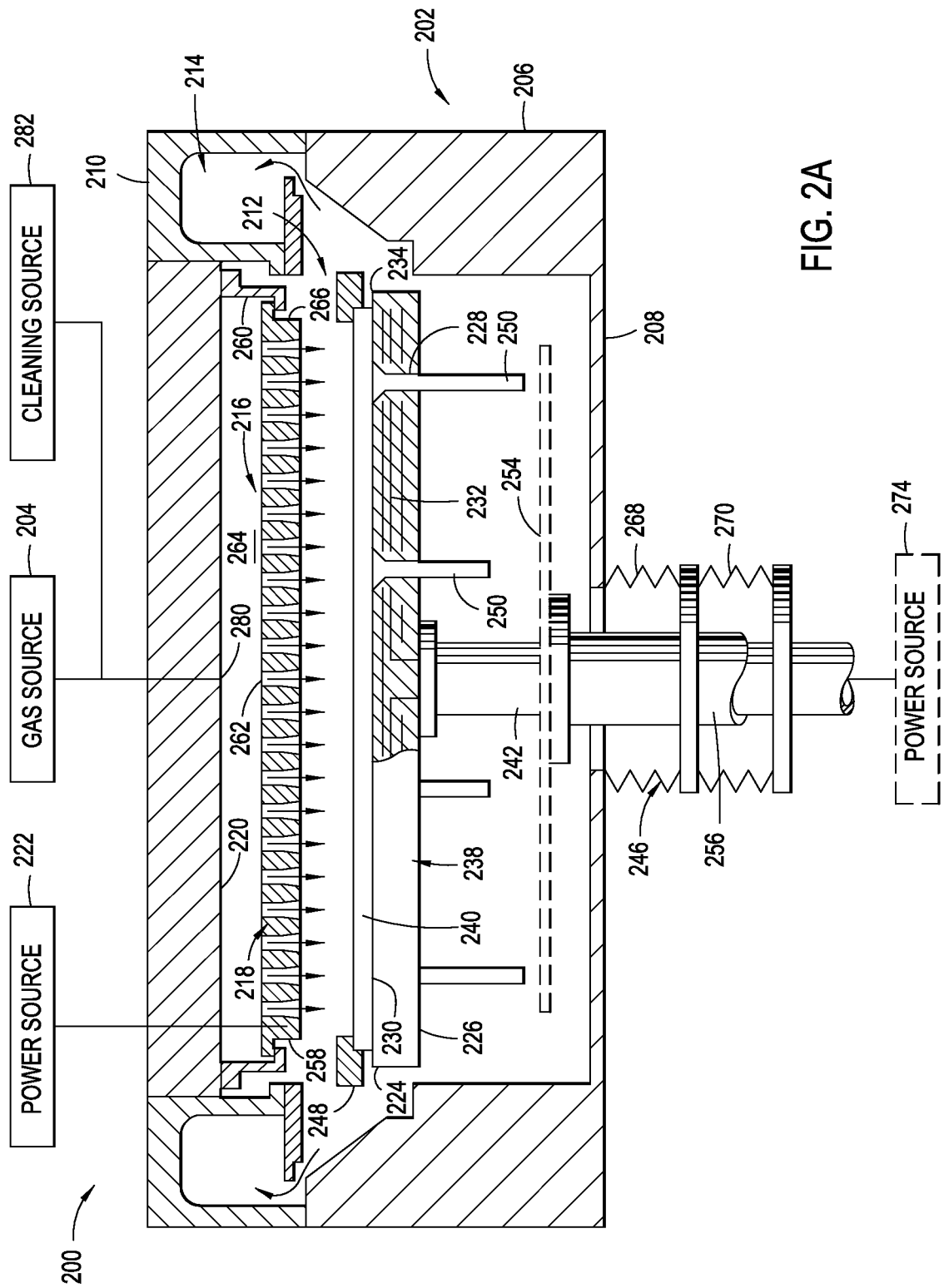
FIG. 2A is a schematic cross-sectional view of an illustrative processing chamber having one embodiment of a gas distribution plate assembly of the present invention.

FIG. 2A is a schematic cross-sectional view of one embodiment of a plasma enhanced chemical vapor deposition system 200, available from AKT, a division of Applied Materials, Inc., Santa Clara, Calif. The system 200 generally includes a processing chamber 202 coupled to a gas source 204. The processing chamber 202 has walls 206 and a bottom 208 that partially define a process volume 212. The process volume 212 is typically accessed through a port (not shown) in the walls 206 that facilitate movement of a substrate 240 into and out of the processing chamber 202. The walls 206 and bottom 208 are typically fabricated from a unitary block of aluminum or other material compatible with processing. The walls 206 support a lid assembly 210 that contains a pumping plenum 214 that couples the process volume 212 to an exhaust port (that includes various pumping components, not shown).

A temperature controlled substrate support assembly 238 is centrally disposed within the processing chamber 202. The support assembly 238 supports a substrate 240 during processing. In one embodiment, the substrate support assembly 238 comprises an aluminum body 224 that encapsulates at least one embedded heater 232. The heater 232, such as a resistive element, disposed in the support assembly 238, is coupled to an optional power source 274 and controllably heats the support assembly 238 and the substrate 240 positioned thereon to a predetermined temperature. Typically, in a CVD process, the heater 232 maintains the substrate 240 at a uniform temperature between about 150 to at least about 460 degrees Celsius, depending on the deposition processing parameters for the material being deposited.

Generally, the support assembly 238 has a lower side 226 and an upper side 234. The upper side 234 supports the substrate 240. The lower side 226 has a stem 242 coupled thereto. The stem 242 couples the support assembly 238 to a lift system (not shown) that moves the support assembly 238 between an elevated processing position (as shown) and a lowered position that facilitates substrate transfer to and from the processing chamber 202. The stem 242 additionally provides a conduit for electrical and thermocouple leads between the support assembly 238 and other components of the system 200.

A bellows 246 is coupled between support assembly 238 (or the stem 242) and the bottom 208 of the processing chamber 202. The bellows 246 provides a vacuum seal between the chamber volume 212 and the atmosphere outside the processing chamber 202 while facilitating vertical movement of the support assembly 238.

The support assembly 238 generally is grounded such that RF power supplied by a power source 222 to a gas distribution plate assembly 218 positioned between the lid assembly 210 and substrate support assembly 238 (or other electrode positioned within or near the lid assembly of the chamber) may excite gases present in the process volume 212 between the support assembly 238 and the distribution plate assembly 218. The RF power from the power source 222 is generally selected commensurate with the size of the substrate to drive the chemical vapor deposition process.

The support assembly 238 additionally supports a circumscribing shadow frame 248. Generally, the shadow frame 248 prevents deposition at the edge of the substrate 240 and support assembly 238 so that the substrate does not stick to the support assembly 238. The support assembly 238 has a plurality of holes 228 disposed therethrough that accept a plurality of lift pins 250. The lift pins 250 are typically comprised of ceramic or anodized aluminum. The lift pins 250 may be actuated relative to the support assembly 238 by an optional lift plate 254 to project from the support surface 230, thereby placing the substrate in a spaced-apart relation to the support assembly 238.

The lid assembly 210 provides an upper boundary to the process volume 212. The lid assembly 210 typically can be removed or opened to service the processing chamber 202. In one embodiment, the lid assembly 210 is fabricated from aluminum (Al). The lid assembly 210 includes a pumping plenum 214 formed therein coupled to an external pumping system (not shown). The pumping plenum 214 is utilized to channel gases and processing by-products uniformly from the process volume 212 and out of the processing chamber 202.

The lid assembly 210 typically includes an entry port 280 through which process gases provided by the gas source 204 are introduced into the processing chamber 202. The entry port 280 is also coupled to a cleaning source 282. The cleaning source 282 typically provides a cleaning agent, such as disassociated fluorine, that is introduced into the processing chamber 202 to remove deposition by-products and films from processing chamber hardware, including the gas distribution plate assembly 218.

The gas distribution plate assembly 218 is coupled to an interior side 220 of the lid assembly 210. The gas distribution plate assembly 218 is typically configured to substantially follow the profile of the substrate 240, for example, polygonal for large area flat panel substrates and circular for wafers. The gas distribution plate assembly 218 includes a perforated area 216 through which process and other gases supplied from the gas source 204 are delivered to the process volume 212. The perforated area 216 of the gas distribution plate assembly 218 is configured to provide uniform distribution of gases passing through the gas distribution plate assembly 218 into the processing chamber 202. Gas distribution plates that may be adapted to benefit from the invention are described in commonly assigned U.S. patent application Ser. No. 09/922,219, filed Aug. 8, 2001, issued as U.S. Pat. No. 6,772,827, by Keller et al.; Ser. No. 10/140,324, filed May 6, 2002; and Ser. No. 10/337,483, filed Jan. 7, 2003 by Blonigan et al.; U.S. Pat. No. 6,477,980, issued Nov. 12, 2002 to White et al.; and U.S. patent application Ser. No. 10/417,592, filed Apr. 16, 2003 by Choi et al., which are hereby incorporated by reference in their entireties.

The gas distribution plate assembly 218 typically includes a diffuser plate 258 suspended from a hanger plate 260. The diffuser plate 258 and hanger plate 260 may alternatively comprise a single unitary member. A plurality of gas passages 262 are formed through the diffuser plate 258 to allow a predetermined distribution of gas passing through the gas distribution plate assembly 218 and into the process volume 212. The hanger plate 260 maintains the diffuser plate 258 and the interior surface 220 of the lid assembly 210 in a spaced-apart relation, thus defining a plenum 264 therebetween. The plenum 264 allows gases flowing through the lid assembly 210 to uniformly distribute across the width of the diffuser plate 258 so that gas is provided uniformly above the center of perforated area 216 and flows with a uniform distribution through the gas passages 262.

Figure 2B:
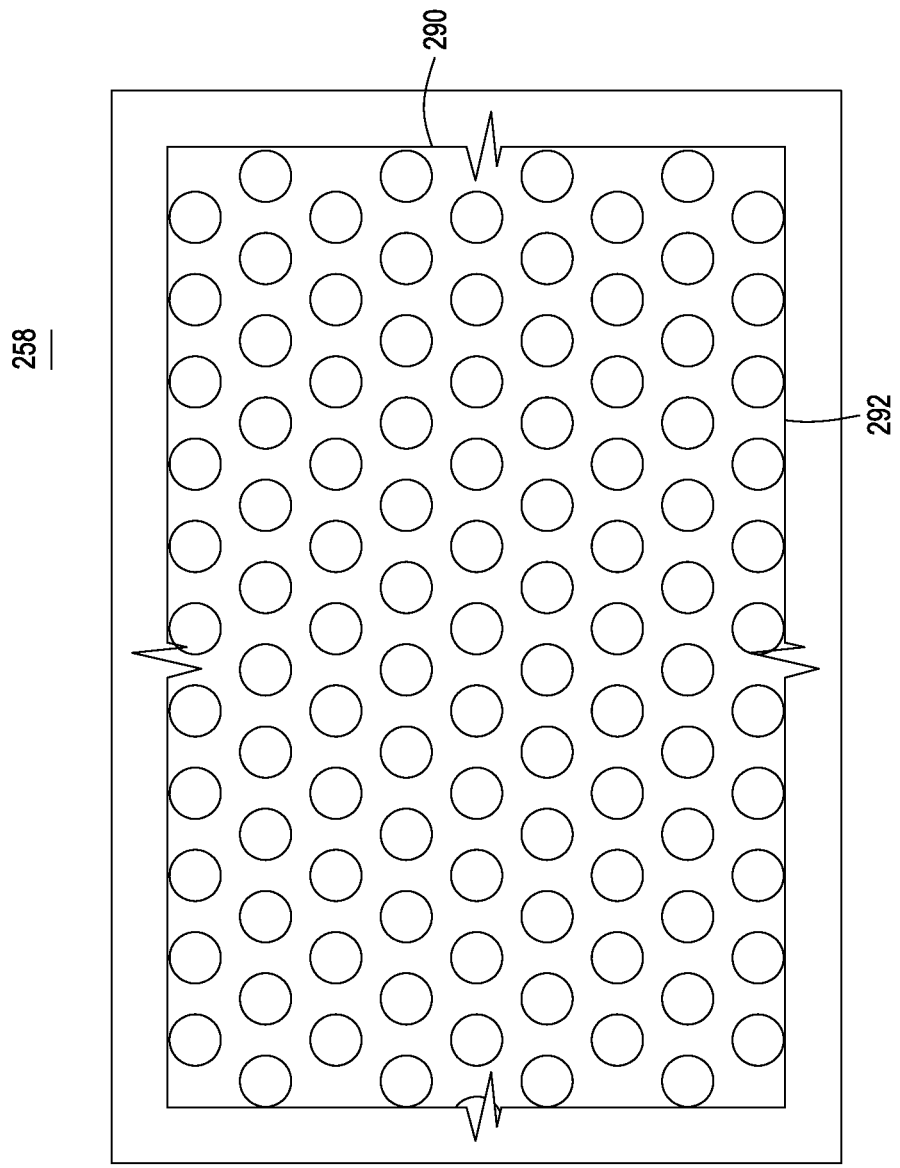
FIG. 2B depicts the bottom view of an embodiment of a gas diffuser plate of the current invention.

The diffuser plate 258 is typically fabricated from stainless steel, aluminum (Al), anodized aluminum, nickel (Ni) or other RF conductive material. The diffuser plate 258 is configured with a thickness that maintains sufficient flatness across the aperture 266 as not to adversely affect substrate processing. In one embodiment the diffuser plate 258 has a thickness between about 1.0 inch to about 2.0 inches. The diffuser plate 258 could be circular for semiconductor wafer manufacturing or polygonal, such as rectangular, for flat panel display manufacturing. FIG. 2B shows an example of a diffuser plate 258 for flat panel display application being a rectangle with width 290 of about 30 inch and length 292 of about 36 inch. The sizes of the diffuser holes, the spacing of diffuser holes, and diffuser plate are not drawn to scale in FIG. 2B.

Figure 3:
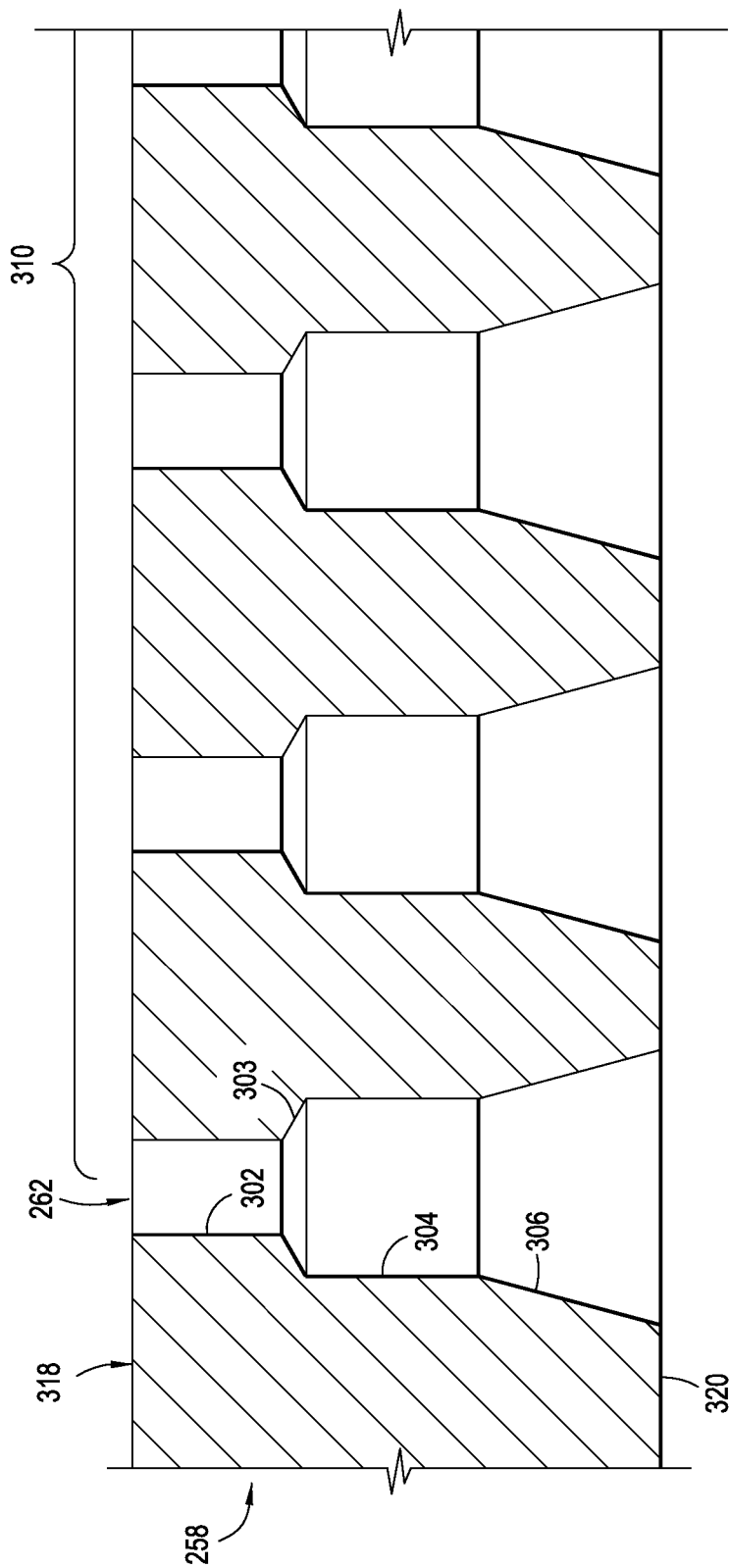
FIG. 3 depicts a cross-sectional schematic view of a gas diffuser plate.

FIG. 3 is a partial sectional view of the diffuser plate 258 that is described in commonly assigned U.S. patent application Ser. No. 10/227,483, titled "Tunable Gas Distribution Plate Assembly", filed on Jan. 7, 2003. For example, for a 1080 in$^2$ (e.g. 30 inches×36 inches) diffuser plate, the diffuser plate 258 includes about 16,000 gas passages 262. For larger diffuser plates used to process larger flat panels, the number of gas passages 262 could be as high as 100,000. The gas passages 262 are generally patterned to promote uniform deposition of material on the substrate 240 positioned below the diffuser plate 258. Referring to FIG. 3, in one embodiment, the gas passage 262 is comprised of a restrictive section 302, a flared connector 303, a center passage 304 and a flared opening 306. The restrictive section 302 passes from the first side 318 of the diffuser plate 258 and is coupled to the center passage 304. The center passage 304 has a larger diameter than the restrictive section 302. The restrictive section 302 has a diameter selected to allow adequate gas flow through the diffusion plate 258 while providing enough flow resistance to ensure uniform gas distribution radially across the perforated center portion 310.

For example, the diameter of the restrictive section 302 could be about 0.016 inch. The flared connector 303 connects the restrictive section 302 to the center passage 304. The flared opening 306 is coupled to the center passage 304 and has a diameter that tapers radially outwards from the center passage 304 to the second side 320 of the diffuser plate 258. The flared openings 306 promote plasma ionization of process gases flowing into the processing region 212. Moreover, the flared openings 306 provide larger surface area for hollow cathode effect to enhance plasma discharge.

As mentioned earlier, large gas distribution plates utilized for flat panel processing have a number of fabricating issues that result in high manufacturing costs. The manufacturing cost of the quad-aperture diffuser plate design in FIG. 3 is relatively high since it requires four drilling steps to drill restrictive section 302, flared connector 303, center passage 304 and flared opening 306 to create each gas passage 262 and the large number of gas passages 262, for example about 16,000 for a 30 inches×36 inches (or 1080 inch$^2$) diffuser plate.

Figure 4A:
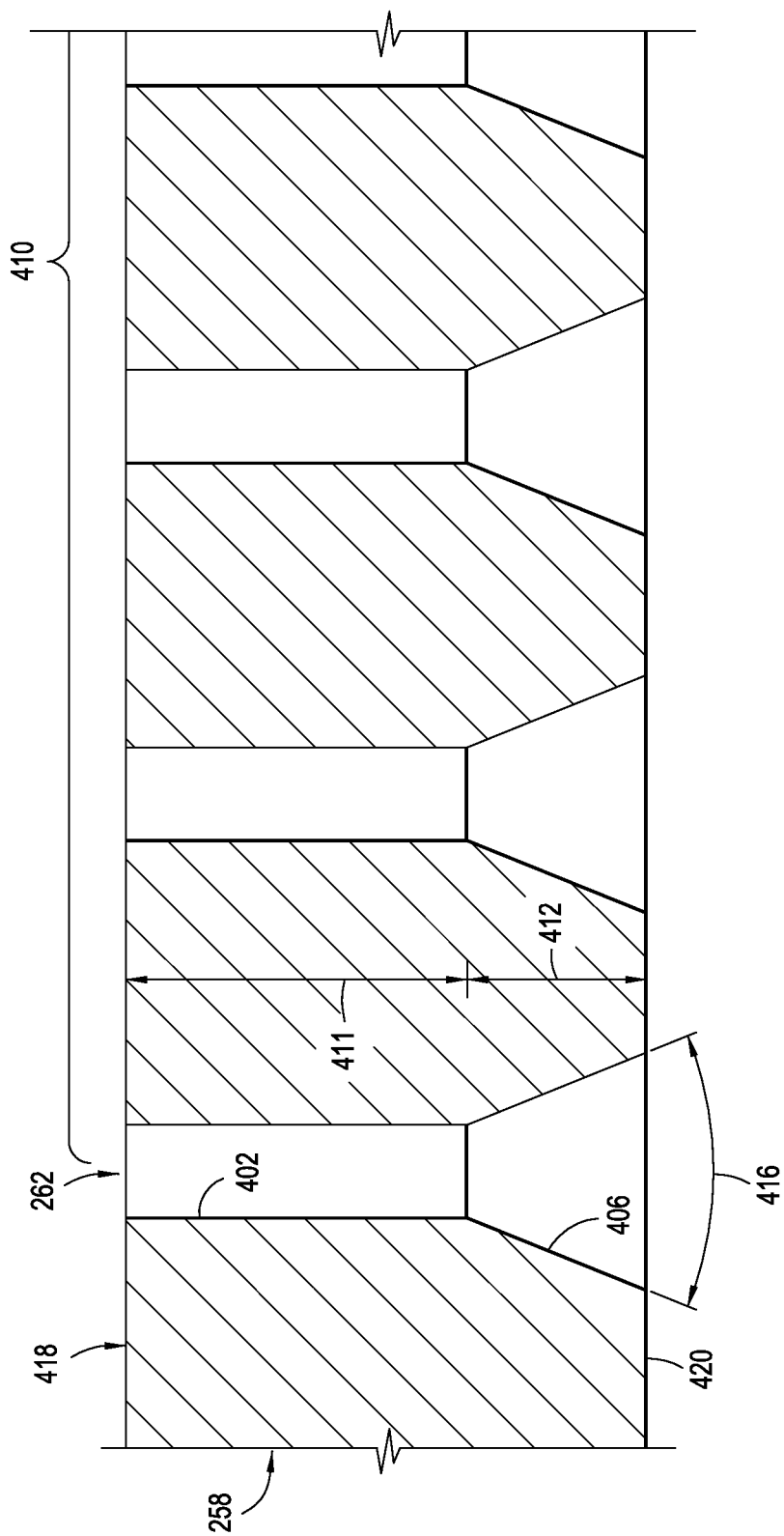
FIG. 4A depicts a cross-sectional schematic view of an embodiment of a gas diffuser plate of the current invention.

FIG. 4A is a partial sectional view of the diffuser plate 258 of the current invention. The diffuser plate 258 includes about 12,000 gas passages 262 for a 30 inches×36 inches (or 1080 inch$^2$) diffuser plate. The gas passage 262 is generally patterned to promote uniform deposition of material on the substrate 240 positioned below the diffuser plate 258. Referring to FIG. 4A, in one embodiment, the gas passage 262 is comprised of a restrictive section 402, and a conical opening 406. The restrictive section 402 passes from the first side 418 of the diffuser plate 258 and is coupled to the conical opening 406. The restrictive section 402 has a diameter between about 0.030 inch to about 0.070 inch, selected to allow adequate gas flow through the diffusion plate 258 while providing enough flow resistance to ensure uniform gas distribution radially across the perforated center portion 410. The edges of the restrictive section of the diffuser holes on the first side 418 of the diffuser plate 258 could be rounded. The conical opening 406 is coupled to the restrictive section 402 and flares radially outwards from the restrictive section 402 to the second side 420 of the diffuser plate 258. The conical opening 406 has a diameter between about 0.2 inch to about 0.4 inch on the second side 420 of the diffuser plate 258. The second side 420 faces the surface of the substrate. The flaring angle 416 of the conical opening 406 is between about 20 to about 35 degrees.

The spacing between flared edges of adjacent gas passages 262 should be kept as small as possible. The flared edges could be rounded. An example of the spacing is 0.05 inch. The maximum spacing between flared edges of adjacent gas passages 262 is about 0.5 inch. The total restriction provided by the restrictive section 402 directly affects the back pressure upstream of the diffuser plate 258, and accordingly should be configured to prevent re-combination of disassociated fluorine utilized during cleaning. The ratio of the length (411) of the restrictive section 402 to the length (412) of the conical opening 406 is between about 0.8 to about 2.0. The total thickness of diffuser plate, which equals the summation of length 411 and length 412, is between about 0.8 inch to about 1.6 inch. The conical openings 406 promote plasma ionization of process gases flowing into the processing region 212. An example of the quad-aperture gas passage design has the restrictive section 402 diameter at 0.042 inch, the length of the restrictive section 402 at 0.0565 inch, the conical opening 406 diameter on the second side 420 of the diffuser plate 258 at 0.302 inch, the length of the conical opening section at 0.0635 inch, and the flaring angle 416 at 22°. The total thickness of the exemplary diffuser plate is 1.2 inches.

Figure 4B:
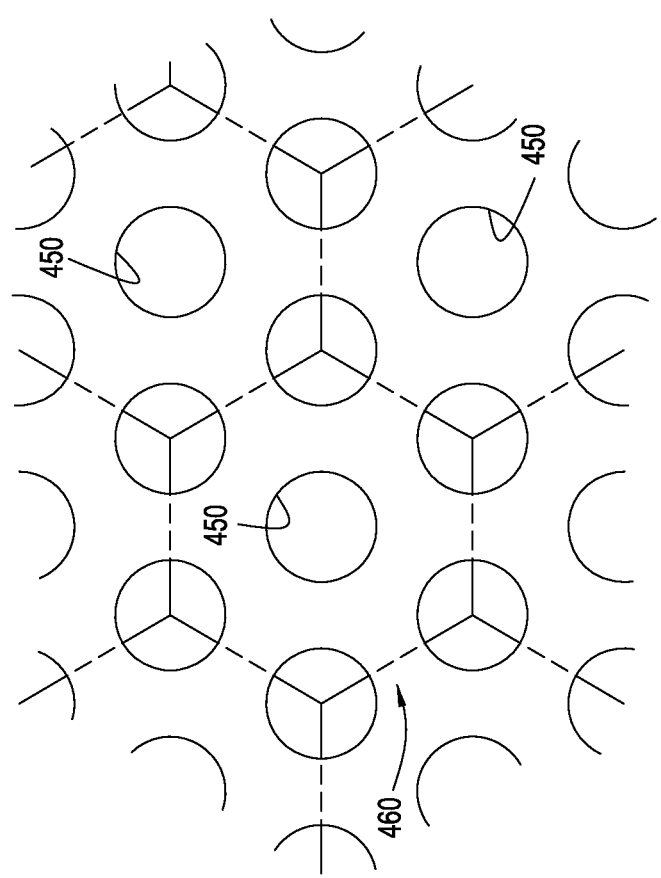
FIG. 4B depicts the top view of a section of an exemplary embodiment of a gas diffuser plate of the current invention

FIG. 4B shows a section of an exemplary embodiment of a hexagonal close pack gas diffuser plate 258. The holes 450 (or gas passages 262 described earlier) are arranged in a pattern of face centered hexagons 460. The size of diffuser holes, and the spacing of diffuser holes are not drawn to scale in FIG. 4B. However, other patterns of gas passages 262 arrangement (or holes 450), such as concentric circles, can also be used.

Figure 4C:
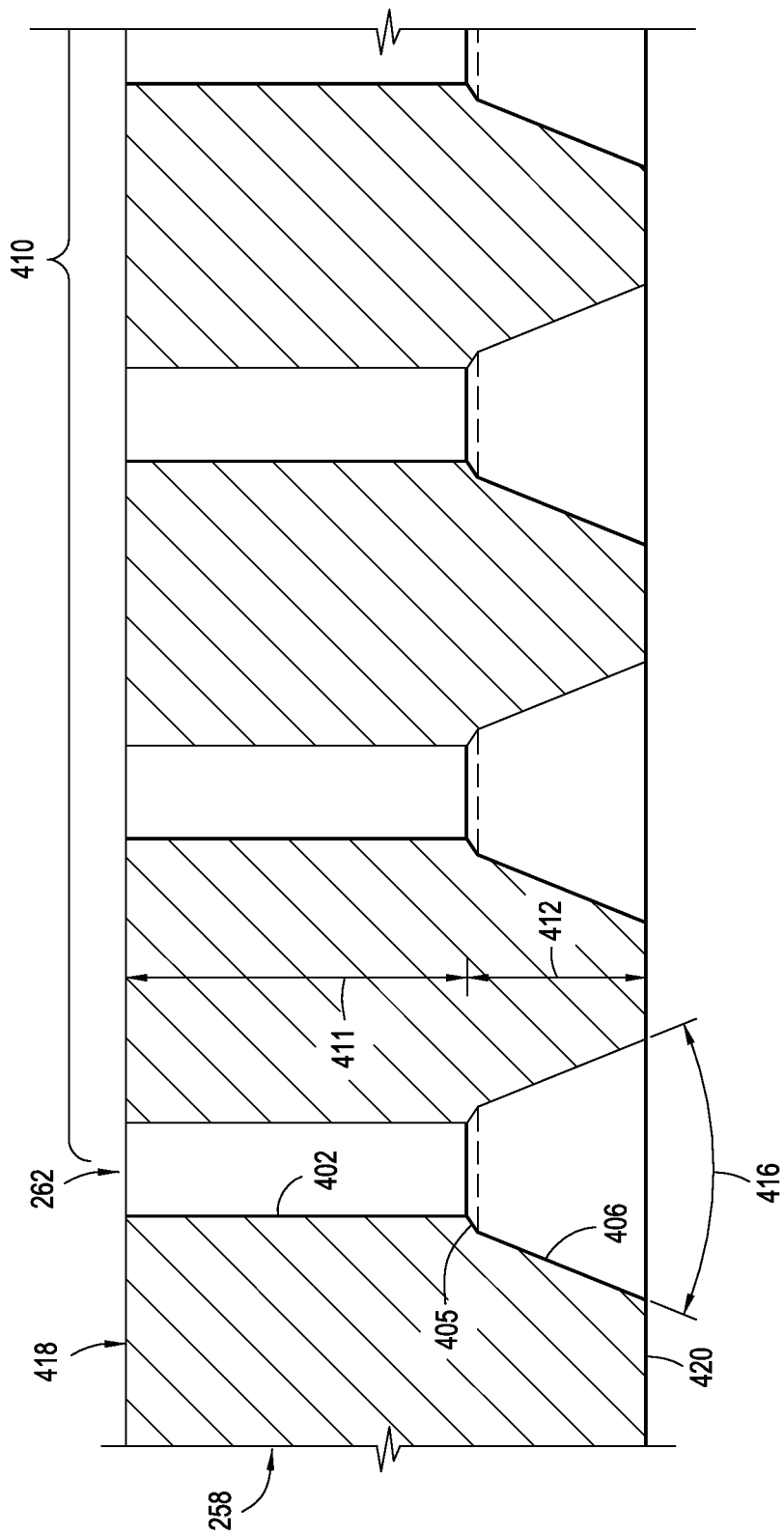
FIG. 4C depicts a cross-sectional schematic view of a variation of the gas diffuser plate design of FIG. 4A.

FIG. 4C shows an alternative design to the design shown in FIG. 4A. During the manufacturing process of machining the restrictive section 402 and the conical opening 406, a flared connecting section 405 could be created by using a different drill to round up (or remove) the burrs left during drilling section 402 and conical opening 406. Aside from the addition of this connecting section 405, the rest of design attributes of FIG. 4C are the same as the design attributes of FIG. 4A.

Comparing the quad-aperture design in FIG. 3 and the funnel design in FIG. 4A, the funnel design diffuser plate is easier to manufacture than the quad-aperture design diffuser plate. Funnel design in FIG. 4A requires drilling two sections which include the restrictive section 402 and the conical section 406; while the quad-aperture design in FIG. 3 requires drilling of 4 sections: the restrictive section 302, flared connector 303, center passage 304 and flared opening 306. Drilling two sections to meet the manufacturing specification is much easier than drilling four sections to meet the manufacturing specification. The funnel design in FIG. 4A also has higher manufacturing yield than the quad-aperture design in FIG. 3 due to lower total number of holes. For example, for a 1080 in$^2$ (e.g. 30 inches×36 inches) diffuser plate, the funnel design has about 12,000 holes, while the quad-aperture design has about 16,000 holes. The funnel design diffuser plate has about 30% less holes than the quad-aperture design diffuser plate. In addition, the funnel design in FIG. 4A has fewer particle problems than the quad-aperture design in FIG. 3 due to its relative simplicity in removing broken drill bits from the larger restrictive section 402 (e.g. 0.040 inch and 0.055 inch), compared to the smaller restrictive section 302 (e.g. 0.016 inch).

In addition to higher manufacturing yield and fewer particle problems, the total surface area of the diffuser plate 258 exposed to the process volume 212 of the funnel design is less than the quad-aperture design, which would reduce the amount of residual fluorine on the diffuser plate (or shower head) from the cleaning process. Reduced residual fluorine could greatly reduce the fluorine incorporation in the film during deposition process. Incorporation of fluorine in the gate dielectric (or insulating) film, such as $SiO_2$, SiON or SiN, generates defect centers that degrade thin film transistor (TFT) device performance, such as $V_t$ (threshold voltage) shift and $I_{on}$ (drive current) reduction. It has been found that if the incorporated contaminants of a gate dielectric film, such as $SiO_2$, SiON or SiN, exceed 1E20 atom/cm$^3$, the TFT device performance could be severely affected. Besides, the quad-aperture design also creates higher back pressure when the cleaning gas is flowing through the gas distribution plate. The disassociated fluorine utilized to clean the plate has an increased propensity to recombine when the back pressure is higher, disadvantageously diminishing cleaning effectiveness.

Figure 5:
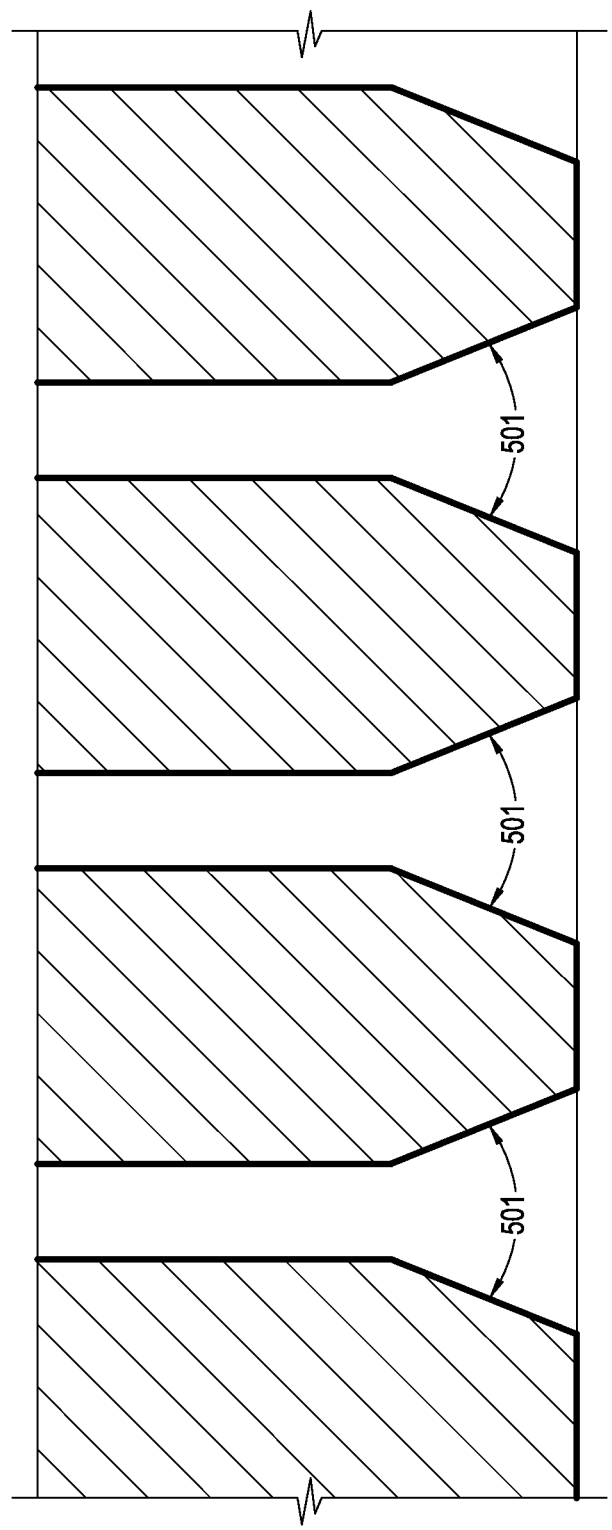
FIG. 5 shows the diffuser surface exposed to the process volume.

A film deposition chamber requires periodic cleaning to reduce the film build-up along chamber surfaces, which might flake off to create particle problems in the process chamber. An example of the cleaning process is the remote plasma source (RPS) clean, which utilizes fluorine containing plasma, generated from fluorine containing gases, such as $NF_3$, $SF_6$, $F_2$, $C_2F_6$, $C_3F_6$ or $C_4F_8O$ etc., to clean. After the cleaning step, a purge gas is used to purge out residual fluorine; however, some residual fluorine species might remain on the chamber and diffuser plate surface areas. The darkened lines (501) in FIG. 5 show the funnel design diffuser surface exposed to the process volume 212. Table 1 compares the total exposed surface areas of two funnel designs (0.040 inch and 0.055 inch restrictive section diameters) and a quad-aperture design. The diameter of the flared end of both funnel designs is 0.302 inch and the flaring angle is 22°. The restrictive section 402 length for both funnel designs is 0.565 inch, while the length of the flared opening 406 for both designs is 0.635 inch. As for the quad-aperture design, the diameter of the restrictive section 302 is 0.016 inch, the diameter of the center passage 304 is 0.156 inch, the large diameter of the flared opening 306 is 0.25 inch and the flaring angle is 22°, the length of restrictive section is 0.046 inch, the length of the flared connector 303 is 0.032 inch, the length of the center passage 304 is 0.88 inch and the length of the flared opening 306 is 0.242 inch. The quad-aperture design has highest number of diffuser holes and highest total diffuser surface area. Both 0.040 inch and 0.055 inch funnel designs have relatively close total exposed diffuser surface areas, which are about half the total exposed diffuser surface area of the quad-aperture design.

| Diffuser Type | Number of diffusers on a 30 × 36 inch² diffuser plate | Total exposed diffuser surface area (inch²) |
| --- | --- | --- |
| Quad-aperture | 16188 | 10594 |
| 0.055 inch Funnel | 11824 | 5352 |
| 0.040 inch Funnel | 11824 | 5666 |

Table 1 compares the total exposed surface areas of two funnel designs (0.040 inch and 0.055 inch restrictive section diameters) and a quad-aperture design.

Figure 6:
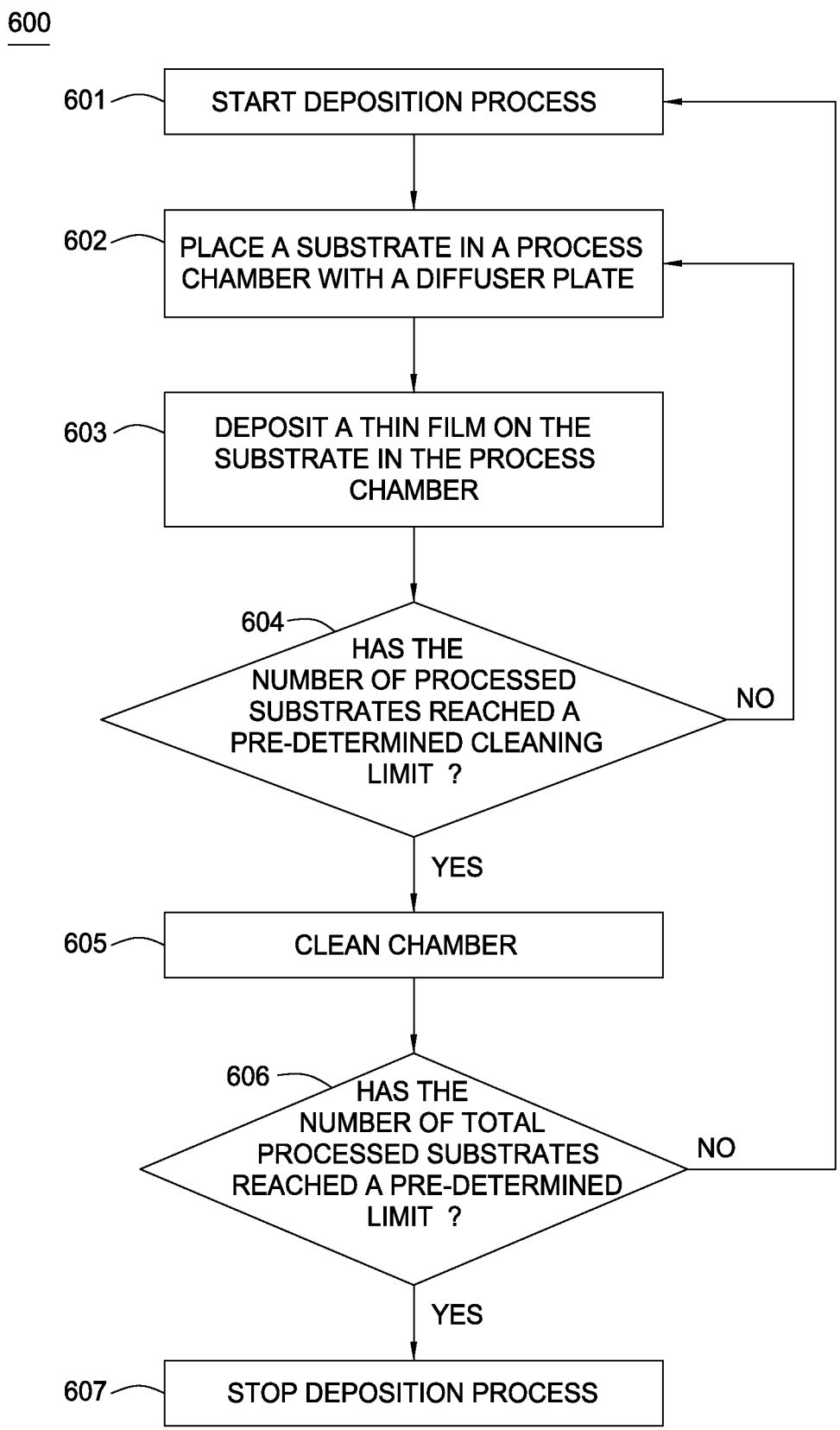
FIG. 6 shows the process flow of depositing a thin film on a substrate in a process chamber with a gas diffuser plate and cleaning the process chamber.

FIG. 6 shows an example of a process flow 600 of depositing a thin film on a substrate in a process chamber with a gas diffuser plate and cleaning the process chamber when cleaning is required. The process starts at step 601, followed by step 602 of placing a substrate in a process chamber with a diffuser plate. Step 603 describes depositing a thin film on the substrate in the process chamber. After step 603, the system decides whether the number of processed substrates has reached a pre-determined cleaning limit at step 604. The pre-determined cleaning limit could be 1 substrate or more than 1 substrate at step 606. If the cleaning limit has not been reached, the process sequence goes back to step 602 of placing another substrate in the process chamber. If the cleaning limit has reached the pre-determined cleaning limit, the process sequence goes to step 605 of cleaning the process chamber. After chamber cleaning at step 605, the system decides whether the number of total processed substrates has reached a pre-determined limit. If the cleaning limit has not been reached, the process sequence goes back to step 601 of starting the deposition process. If the cleaning limit has been reached the pre-determined limit, the deposition process stops at step 607. Process flow 600 is only used as an example to demonstrate the concept. The invention can also apply to process flows that involves other process steps or sequences, but fit into the general concept of deposition and cleaning.

Figure 7:
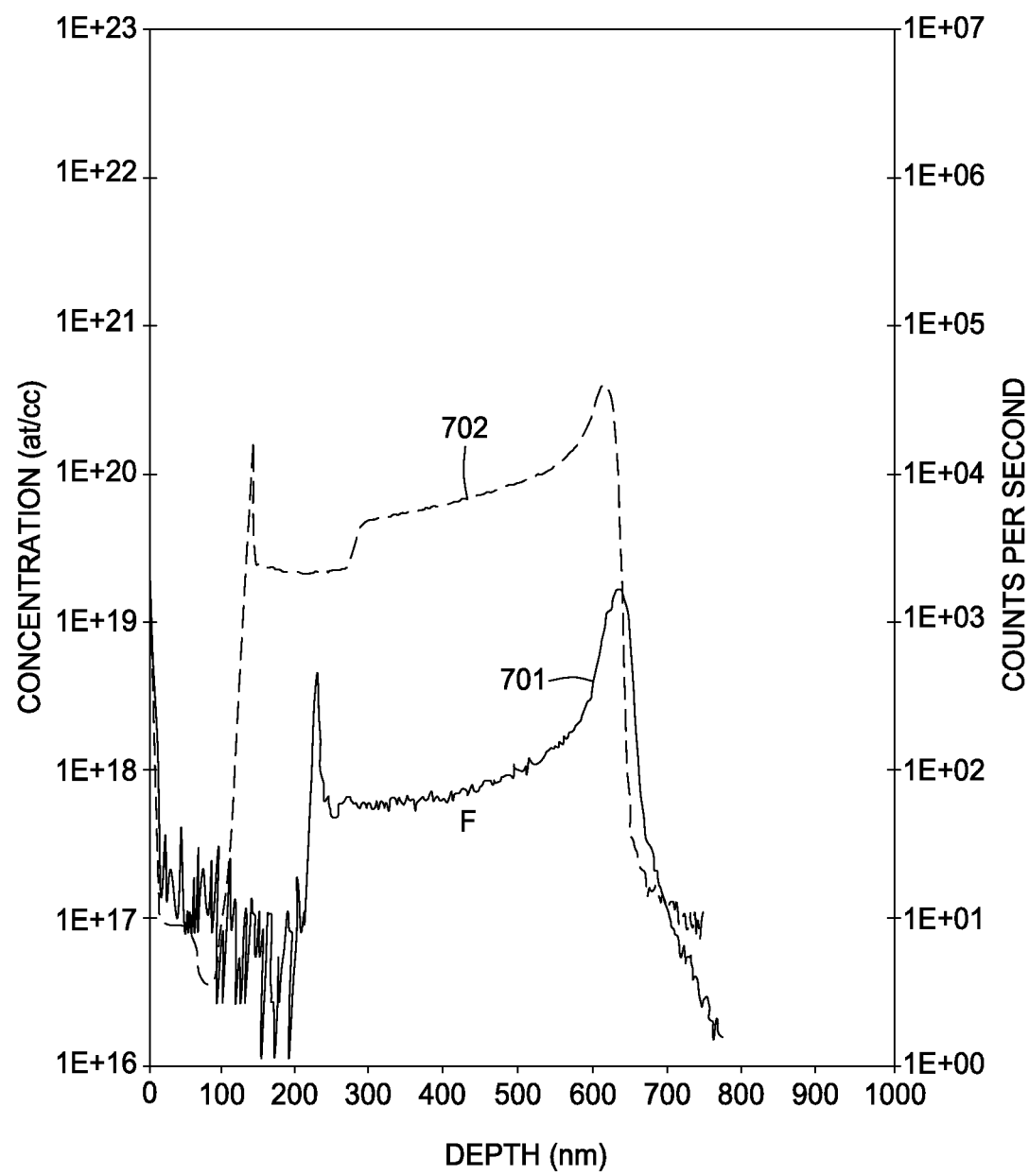
FIG. 7 shows the secondary ion mass spectrometer (SIMS) analysis of the fluorine content of SiN film of the FIG. 3 and FIG. 4A designs.

FIG. 7 shows the secondary ion mass spectrometer (SIMS) analysis of the fluorine content of film stacks, which contain SiN film, deposited with diffuser plates of the two designs. The film stack analyzed includes about 500 Å phosphorus doped (n+) amorphous silicon film, about 2200 Å amorphous silicon film, followed by about 4500 Å silicon nitride film on a glass substrate. The amorphous silicon and the silicon nitride films have been sequentially deposited with the same diffuser plate (or shower head) in the same PECVD chamber. Curve 701 shows the fluorine content of the 0.055 inch funnel design in the SiN film (less than 1E18 atom/cm³) is more than one order of magnitude lower than the films processed with the quad-aperture design diffuser plate (curve 702, about 5E19 atom/cm³). The lower fluorine content resulting from the funnel design is possibly due to lower total surface area of the diffuser plate 258 exposed to the process volume 212 compared to the quad-aperture design.

Chamber cleaning is accomplished by remote plasma source (RPS) clean which uses the fluorine radicals (F*) generated from fluorine-containing gases, such as $NF_3$, $SF_6$, $F_2$, $C_2F_6$, $C_3F_6$ or $C_4F_8O$ etc. The fluorine-containing gas (or gases) could be diluted by an inert gas, such as argon (AR), to help sustain the plasma. However, the inert gas is optional. Generally, the cleaning process is performed with inert gas flowing at between about 0 slm to about 6 slm, fluorine containing gas flowing at between 1 slm to about 6 slm and the pressure of the remote plasma source generator is maintained at between 0.5 Torr to 20 Torr. Equation (1) shows the example of using $NF_3$ as the cleaning gas:

$$NF_3 \rightarrow N^* + 3F^* \qquad (1)$$

The fluorine radical (F*) can also recombine to form fluorine gas ($F_2$), which does not have the same cleaning effect as the fluorine radical (F*) for SiN film. The reduction of cleaning efficiency due to fluorine radical recombination is stronger on SiN film cleaning than on amorphous silicon film cleaning, since amorphous silicon can also be cleaned by thermal $F_2$ processing. Equation (2) shows the reaction of fluorine radical recombination.

$$2F^* \rightarrow F_2 \qquad (2)$$

The fluorine radicals can recombine before they reach the reaction chamber. Although not wishing to be bound by any theory, unless explicitly set forth in the claims, narrower passages in the diffusers and higher back pressure in plenum 264 could enhance fluorine radical recombination prior to entering the process volume 212 and could reduce the cleaning efficiency.

Table 2 compares the remote plasma source cleaning rates for SiN film and α-Si film deposited in a PECVD chamber under identical conditions for the three designs mentioned in Tables 2 and 3. The remote plasma source cleaning species is generated by flowing 4 slm Ar and 4 slm $NF_3$ into an ASTeX remote plasma source (RPS) generator that is maintained at 6 Torr. The ASTeX remote plasma source generator is made by MKS Instruments, Inc. of Wilmington, Mass.

| | Cleaning rate (Å/min) | | |
| --- | --- | --- | --- |
| Film | Quad-aperture | 0.055 in. Funnel | 0.040 in. Funnel |
| SiN | 7806 | 9067 | 7517 |
| α-Si | 5893 | 6287 | 5595 |

Table 2 compares the RPS clean rate of 3 types of diffuser designs for SiN and α-Si films.

The results show that 0.055 inch funnel shaped diffuser has the best cleaning performance, followed by the quad-aperture design and with 0.040 inch funnel being the last. The result is likely due to the lower back pressure and less restrictive diffuser path of the 0.055 inch funnel diffuser compared to the quad-aperture and 0.040 inch funnel design, which results in less F* recombination and higher cleaning efficiency.

Table 3 shows the back pressure (Pb) of the RPS cleaning process when Ar flow is at 4 slm and $NF_3$ is between 0-4 slm, for both RPS plasma on and off conditions.

| Flow (slm) | Pb (mTorr), Quad-aperture | | Pb (mTorr), 0.055 inch Funnel | | Pb (mTorr), 0.040 inch Funnel | |
|---|---|---|---|---|---|---|
| $NF_3$ | $Pb_{plasma-off}$ | $Pb_{plasma-on}$ | $Pb_{plasma-off}$ | $Pb_{plasma-on}$ | $Pb_{plasma-off}$ | $Pb_{plasma-on}$ |
| 0 | 1280 | 1280 | 930 | 930 | 1260 | 1260 |
| 1 | 1530 | 1840 | 1070 | 1310 | 1450 | 1730 |
| 2 | 1770 | 2370 | 1200 | 1650 | 1640 | 2150 |
| 3 | 2000 | 2850 | 1330 | 1940 | 1810 | 2530 |
| 4 | 2220 | 3300 | 1470 | 2210 | 1960 | 2880 |

Table 3 compares the back pressure of 3 types of diffuser design under different $NF_3$ flow and when RPS plasma is on and off.

The 0.055 inch funnel diffuser has lowest back pressure and has least F* recombination and highest SiN film clean rate. However, the back pressure of the quad-aperture design is higher than the back pressure of 0.040 inch funnel design and yet the cleaning rate of the quad-aperture design is higher than 0.040 inch funnel design. This shows that recombination due to pressure difference alone does not explain the cleaning rate result. The recombination in the diffuser also plays an important role.

Table 4 compares the narrowest diameters, lengths and volumes of the diffuser passages of quad-aperture and 0.040 inch funnel designs. The 0.040 inch funnel design has a larger passage volume compared to the quad-aperture design. The larger passage volume could allow additional fluorine radical recombination than in the narrow diffuser passage and affect the clean rate result.

|  | Quad-aperture | 0.040 in. Funnel |
|---|---|---|
| Narrowest diameter in the diffuser passage (in.) | 0.016 | 0.040 |
| Length of narrowest diffuser passage (in.) | 0.046 | 0.565 |
| Volume of narrowest diffuser passage ($in^3$) | 0.00001 | 0.00071 |

Table 4 compares the diameter, the length and the volume of the narrowest section in the diffuser for the quad-aperture and 0.040 inch funnel designs.

Clean rate is also dependent upon cleaning gas (such as $NF_3$) dissociation efficiency. Table 5 shows the chamber pressure (in the process volume 212) data of the three designs under RPS cleaning process. The chamber pressure for all three diffuser designs are all in a similar range.

| Flow (slm) | Pc (mTorr), Quad-aperture | | Pc (mTorr), 0.055 inch Funnel | | Pc (mTorr), 0.040 inch Funnel | |
|---|---|---|---|---|---|---|
| $NF_3$ | $Pc_{plasma-off}$ | $Pc_{plasma-on}$ | $Pc_{plasma-off}$ | $Pc_{plasma-on}$ | $Pc_{plasma-off}$ | $Pc_{plasma-on}$ |
| 0 | 345 | 345 | 330 | 330 | 323 | 323 |
| 1 | 391 | 460 | 374 | 451 | 365 | 430 |
| 2 | 438 | 584 | 420 | 567 | 409 | 536 |
| 3 | 483 | 692 | 464 | 676 | 452 | 635 |
| 4 | 528 | 796 | 506 | 773 | 494 | 731 |

Table 5 compares the chamber pressure of 3 types of diffuser design under different $NF_3$ flow and when plasma is on and off.

$NF_3$ dissociation efficiency is directly proportional to the ratio of the net pressure increase when plasma is on to the net pressure increase when plasma is off. Table 6 shows the ratio of the net pressure increase when plasma is on to the net pressure increase when plasma is off for the quad-aperture, 0.055 inch funnel and 0.040 inch funnel designs. $\Delta Pc_{plasma-on}$ represents the pressure difference between the chamber pressure under certain $NF_3$ flow to the chamber pressure under 0 $NF_3$ flow when the plasma is on. Similarly, $\Delta c_{plasma-off}$ represents the pressure difference between the back pressure under certain $NF_3$ flow to the chamber pressure under 0 $NF_3$ flow when the plasma is off. The ratio of $\Delta Pc_{plasma-on}$ over $\Delta Pc_{plasma-off}$ quantifies the $NF_3$ dissociation efficiency. The dissociation efficiency decreases with the increase of $NF_3$ flow rate. The dissociation efficiency is highest for 0.055 inch funnel design, followed by the quad-aperture design and then 0.040 inch funnel design. The $NF_3$ dissociation efficiency data correlate with the cleaning rate data.

| $NF_3$ flow rate (slm) | $\Delta Pc_{plasma-on}/\Delta Pc_{plasma-off}$, Quad-aperture | $\Delta Pc_{plasma-on}/\Delta Pc_{plasma-off}$, 0.055 in. Funnel | $\Delta Pc_{plasma-on}/\Delta Pc_{plasma-off}$, 0.040 in. Funnel |
|---|---|---|---|
| 1 | 2.50 | 2.75 | 2.55 |
| 2 | 2.57 | 2.63 | 2.48 |
| 3 | 2.51 | 2.58 | 2.42 |
| 4 | 2.46 | 2.52 | 2.39 |

Table 6 compares the ratio of the net pressure increase when plasma is on to the net pressure increase when plasma is off for the 3 designs.

In addition to cleaning efficiency, the impact of the diffuser design on the deposition performance should also be examined to ensure deposition performance meets the requirements. Table 7 compares the SiN and α-Si deposition uniformities and rates using the different diffuser designs under the same process conditions for the 3 diffuser designs. The SiN film is deposited using 600 sccm $SiH_4$, 2660 sccm $NH_3$ and 6660 sccm $N_2$, under 1.5 Torr and 3050 watts source power. The spacing between the diffuser plate and the support assembly is 1.09 inch. The process temperature is maintained at about 355° C. The α-Si film is deposited using 1170 sccm $SiH_4$ and 4080 sccm $H_2$, under 3.0 Torr and 950 watts source power. The spacing between the diffuser plate and the support assembly is 1.09 inch. The process temperature is maintained at 355° C.

| Film | Quad-aperture | | 0.055 inch Funnel | | 0.040 inch Funnel | |
|---|---|---|---|---|---|---|
| | Uniformity (%) | Dep rate (Å/min) | Uniformity (%) | Dep rate (Å/min) | Uniformity (%) | Dep rate (Å/min) |
| SiN | 3.8 | 1746 | 4.3 | 1738 | 3.2 | 1740 |
| α-Si | 3.9 | 1272 | 4.5 | 1261 | 4.4 | 1226 |

Table 7 compares the SiN and α-Si films deposition uniformities and rates for the 3 designs.

The results show that the deposition rates and uniformities of the three designs are relatively comparable. The deposition rates are about the same for the three designs. The uniformity of 0.055 inch funnel design is worse than the quad-aperture design. However, the uniformity can be improved by narrowing the diameter of the restrictive section 402 (0.040 inch vs. 0.055 inch). The uniformity of 0.040 inch funnel design (3.2% and 4.4%) is better than 0.055 inch funnel design (4.3% and 4.5%). For SiN film, the 0.040 inch funnel design (3.2%) is even better than the quad-aperture design (3.8%). Other film properties, such as film stress, reflective index, and wet etch rate, are equivalent for the three designs. The results show that the film uniformity is affected by the diffuser design and can be tuned by adjusting the diameter of the restrictive section. The results also show that the funnel design can achieve the same deposition properties, such as uniformity, deposition rate, film stress, reflective index and wet etch rate, as the quad-aperture design.

In addition to the diffuser design, process pressure can also affect deposition rate and uniformity. Table 8 shows the effect of process pressure (or chamber pressure) on uniformity and deposition rate for 0.055 inch funnel design diffuser. Lower chamber pressure gives better uniformity and lower deposition rate.

| Chamber pressure (Torr) | Uniformity (%) | Deposition rate (Å/min) |
|---|---|---|
| 1.2 | 3.9 | 1545 |
| 1.5 | 5.5 | 1756 |
| 1.8 | 5.1 | 1784 |

Table 8 shows the deposition pressure, uniformity and deposition rate of SiN film using a 0.055 inch funnel design diffuser plate.

The funnel design diffuser plate is easier to manufacture compared to the quad-aperture design diffuser plate. Therefore, the yield and cost of manufacturing the funnel design diffuser plate is improved. In addition to ease of manufacturing, the funnel design diffuser plate also has the benefit of less residual fluorine on the diffuser plate after RPS clean. This results in less fluorine incorporation in the gate dielectric films and improved device performance. The funnel design could have better or equivalent clean rate and efficiency compared to the quad-aperture design, depending on the diameter of the restrictive section 402 selected. The funnel design also could have deposition rate and uniformity performance equivalent to the quad-aperture design.

Figure 8A:
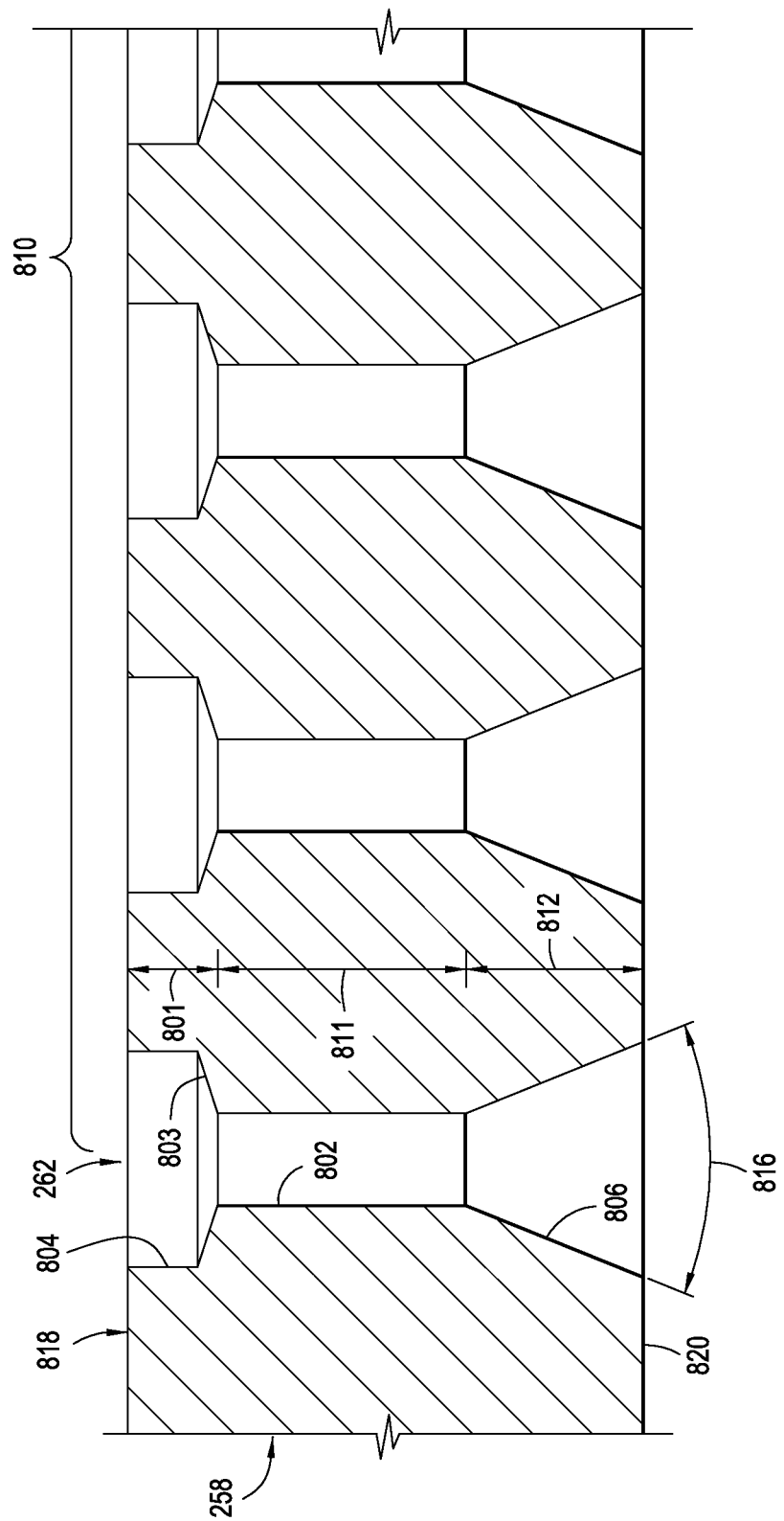
FIG. 8A depicts a cross-sectional schematic view of a variation of the gas diffuser plate design of FIG. 4A for thicker diffuser plate.

For a flat panel display with larger surface area, diffuser plate 258 with larger top surface area may be required. With the increase of top surface area, the thickness of the diffuser plate 258 may increase to maintain the strength in supporting the diffuser plate. FIG. 8A shows a variation of the funnel design in FIG. 4A for a thicker diffuser plate. All the corresponding design attributes of FIG. 8A are same as FIG. 4A. The guidelines used to design the restrictive section 802, the flared section 806, and flaring angle 816 are similar to the guideline used to design the restrictive section 402, the conical opening 406, and flaring angle 416 of FIG. 4A respectively. The presently preferred configuration of the flared section 806 is the conical cross-section shown in FIG. 8A. However, other configurations including concave cross-sections, such as parabolic, and convex cross-sections, can be used as well. The difference between FIG. 8A and FIG. 4A is that FIG. 8A is thicker by the length 801. A larger diameter section 804 can be created between the first side 818 of the diffuser plate 258 and the restrictive section 802. The large diameter section 804 is connected to the restrictive section 802 by a flared connector 803. During the manufacturing process of machining the restrictive section 802 and the larger diameter section 804, the flared connecting section 803 is created by using a different drill to round up (or remove) the burrs left during drilling sections 802 and 804. Since the large diameter section 804 has larger diameter than restrictive section 802, it only slightly increases the manufacturing time and does not affect manufacturing yield. The diameter of the larger diameter section 804 should be at least two times the diameter of the restrictive section 802 to ensure that the addition of the larger diameter section also does not change the backpressure and chamber pressure during processing as compared to the funnel design in FIG. 4A. Due to this, the deposition process and the qualities of the film deposited using the design in FIG. 8A are similar to the deposition process and the qualities of the film deposited by the funnel design of FIG. 4A. The larger diameter section 804 has a diameter between about 0.06 inch to about 0.3 inch. The edges of the larger diameter section 804 of the diffuser holes on the first side 818 of the diffuser plate 258 could be rounded. The ratio of the length 801 of the larger diameter section to the length 811 of the restrictive section 802 should be between about 0.3 to about 1.5. The total thickness of the diffuser plate, which equals the summation of length 801, length 811 and length 812, is between about 1.0 inch to about 2.2 inch.

Figure 8B:
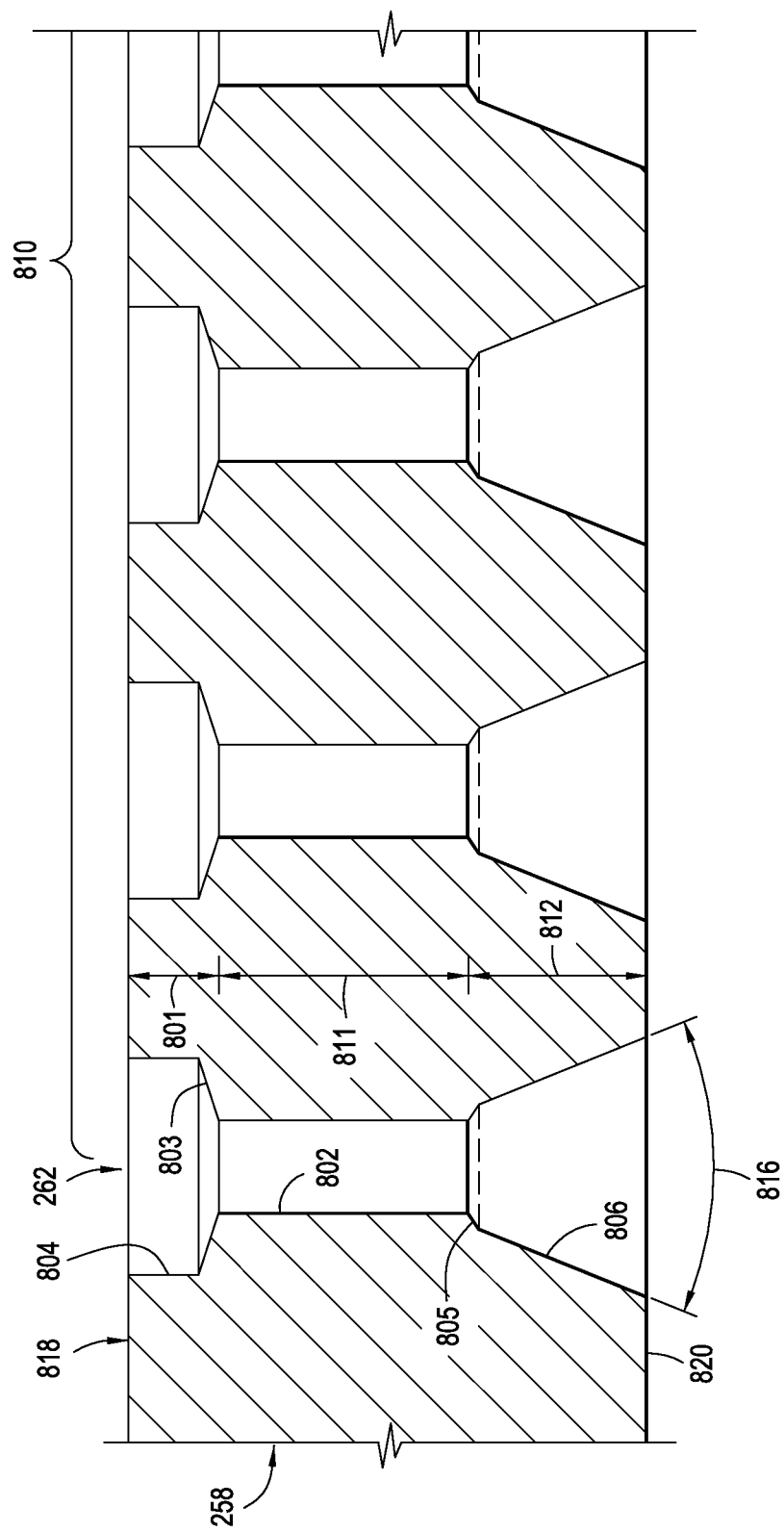
FIG. 8B depicts a cross-sectional schematic view of another variation of the gas diffuser plate design of FIG. 8A.

FIG. 8B shows an alternative design to the design shown in FIG. 8A. During the manufacturing process of machining the restrictive section 802 and the flared section 806, a flared connecting section 805 could be created by using a different drill to round up (or remove) the burrs left during drilling sections 802 and 806. Aside from the addition of this connecting section 805, the rest of design attributes of FIG. 8B are the same as the design attributes of FIG. 8A.

Although several preferred embodiments which incorporate the teachings of the present invention have been shown and described in detail, those skilled in the art can readily devise many other varied embodiments that still incorporate these teachings.

The invention claimed is:
1. A gas distribution plate assembly, comprising:
 a diffuser plate having an upstream side, a downstream side, wherein the diffuser plate has a thickness between about 1.0 inch and about 2.2 inches and an area greater than about 1080 square inches;
 a plurality of gas passages passing between the upstream and downstream sides, wherein each of the gas passages comprise:
  a first cylindrical section extending from the upstream side;
  a first coaxial conical section extending from the downstream side;

a first connecting section connected to the first cylindrical section and a second coaxial cylindrical section;

wherein a ratio of a length of the second coaxial cylindrical section to a length of the first coaxial conical section is between 0.8 and 2.0 and a ratio of a length of the first cylindrical section to a length of the second coaxial cylindrical section is between 0.3 and 1.5; and a second connecting section connected to the second coaxial cylindrical section and the first coaxial conical section.

2. The gas distribution plate assembly of claim 1, wherein the downstream side of a first opening in the first connecting section is smaller than the downstream side of a second opening in the second connecting section.

3. The gas distribution plate assembly of claim 1, wherein the first connecting section and the second connecting section are coaxial conical sections.

4. The gas distribution plate assembly of claim 3, wherein the upstream side of the first connecting section has a smaller diameter than the downstream side of the first coaxial conical section.

5. The gas distribution plate assembly of claim 1, wherein a diameter of the first cylindrical section is between about 0.06 inch and about 0.3 inch.

6. The gas distribution plate assembly of claim 1, wherein a diameter of the second coaxial cylindrical section is between about 0.03 inch and about 0.07 inch.

7. The gas distribution plate assembly of claim 1, wherein the diffuser plate is rectangular.

8. The gas distribution plate assembly of claim 1, wherein the first coaxial conical section is flared at about 20 degrees to about 35 degrees.

9. The gas distribution plate assembly of claim 1, wherein the diffuser plate is polygonal.

10. The gas distribution plate assembly of claim 1, wherein a spacing between each first coaxial conical section is between about 0.05 inches and about 0.5 inches.

11. A process chamber, comprising:
one or more walls, a bottom, and a diffuser plate defining a processing volume, wherein the diffuser plate has an upstream side, a downstream side, wherein the diffuser plate has a thickness between about 1.0 inch and about 2.2 inches and an area greater than about 1080 square inches;
a plurality of gas passages passing between the upstream and downstream sides, wherein each of the gas passages comprise:
a first cylindrical section extending from the upstream side;
a first coaxial conical section extending from the downstream side;
a first connecting section connected to the first cylindrical section and a second coaxial cylindrical section;
wherein a ratio of a length of the second coaxial cylindrical section to a length of the first coaxial conical section is between 0.8 and 2.0 and a ratio of a length of the first cylindrical section to a length of the second coaxial cylindrical section is between 0.3 and 1.5;
a second connecting section connected to the second coaxial cylindrical section and the first coaxial conical section; and
a substrate pedestal disposed within the processing volume.

12. The process chamber of claim 11, wherein the downstream side of a first connecting section is smaller than the downstream side of a second opening in the second connecting section.

13. The process chamber of claim 11, wherein the first connecting section and the second connecting section are coaxial conical sections.

14. The process chamber of claim 13, wherein the upstream side of the first connecting section has a smaller diameter than the downstream side of the first coaxial conical section.

15. The process chamber of claim 11, wherein a diameter of the first cylindrical section is between about 0.06 inch and about 0.3 inch.

16. The process chamber of claim 11, wherein a diameter of the second coaxial cylindrical section is between about 0.03 inch and about 0.07 inch.

17. The process chamber of claim 11, wherein the diffuser plate is rectangular.

18. The process chamber of claim 11, wherein the first coaxial conical section is flared at about 20 degrees to about 35 degrees.

19. The process chamber of claim 11, wherein the diffuser plate is polygonal.

20. The process chamber of claim 11, wherein a spacing between each first coaxial conical section is between about 0.05 inches and about 0.5 inches.

* * * * *